United States Patent
Miyanaga et al.

(10) Patent No.: US 10,655,213 B2
(45) Date of Patent: May 19, 2020

(54) OXIDE SINTERED MATERIAL, METHOD OF PRODUCING OXIDE SINTERED MATERIAL, SPUTTERING TARGET, AND METHOD OF PRODUCING SEMICONDUCTOR DEVICE

(71) Applicant: Sumitomo Electric Industries, Ltd., Osaka-shi (JP)

(72) Inventors: Miki Miyanaga, Itami (JP); Kenichi Watatani, Itami (JP); Hideaki Awata, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 391 days.

(21) Appl. No.: 15/520,933

(22) PCT Filed: May 6, 2016

(86) PCT No.: PCT/JP2016/063646
§ 371 (c)(1),
(2) Date: Apr. 21, 2017

(87) PCT Pub. No.: WO2017/047152
PCT Pub. Date: Mar. 23, 2017

(65) Prior Publication Data
US 2018/0023188 A1  Jan. 25, 2018

(30) Foreign Application Priority Data
Sep. 16, 2015  (JP) .................. 2015-182931

(51) Int. Cl.
C23C 14/34 (2006.01)
C04B 35/01 (2006.01)
(Continued)

(52) U.S. Cl.
CPC .......... *C23C 14/3414* (2013.01); *C04B 35/01* (2013.01); *C04B 35/453* (2013.01);
(Continued)

(58) Field of Classification Search
CPC . C04B 35/01; C04B 35/453; C04B 35/62645; C04B 35/64; C23C 14/08;
(Continued)

(56) References Cited

U.S. PATENT DOCUMENTS 10,087,517 B2 * 10/2018 Miyanaga ............... C04B 35/00
2015/0279943 A1   10/2015 Nakayama

FOREIGN PATENT DOCUMENTS

| JP | 09-071860 A | 3/1997 |
|----|-------------|--------|
| JP | 2005-314131 A | 11/2005 |

(Continued)

*Primary Examiner* — Rodney G McDonald
(74) *Attorney, Agent, or Firm* — Baker Botts L.L.P.; Michael A. Sartori

(57) ABSTRACT

There is provided an oxide sintered material containing indium, tungsten, and zinc, the oxide sintered material including: a first crystal phase that is a main component of the oxide sintered material and includes a bixbyite type crystal phase; and a second crystal phase having a content of the zinc higher than a content of the zinc in the first crystal phase, the second crystal phase including particles having an average major axis size of not less than 3 μm and not more than 50 μm and having an average aspect ratio of not less than 4 and not more than 50.

4 Claims, 5 Drawing Sheets

(51) Int. Cl.
*C04B 35/64* (2006.01)
*C23C 14/08* (2006.01)
*C04B 35/626* (2006.01)
*H01L 29/786* (2006.01)
*H01L 29/66* (2006.01)
*H01L 21/02* (2006.01)
*C04B 35/453* (2006.01)
*H01J 37/34* (2006.01)

(52) U.S. Cl.
CPC ........ *C04B 35/62645* (2013.01); *C04B 35/64* (2013.01); *C23C 14/08* (2013.01); *C23C 14/083* (2013.01); *C23C 14/086* (2013.01); *H01J 37/3426* (2013.01); *H01L 21/0257* (2013.01); *H01L 21/02554* (2013.01); *H01L 21/02565* (2013.01); *H01L 21/02592* (2013.01); *H01L 21/02631* (2013.01); *H01L 29/66969* (2013.01); *H01L 29/7869* (2013.01); *C04B 2235/326* (2013.01); *C04B 2235/3258* (2013.01); *C04B 2235/3284* (2013.01); *C04B 2235/3286* (2013.01); *C04B 2235/5436* (2013.01); *C04B 2235/5445* (2013.01); *C04B 2235/5463* (2013.01); *C04B 2235/77* (2013.01); *C04B 2235/786* (2013.01); *C04B 2235/788* (2013.01); *C04B 2235/80* (2013.01); *H01L 29/78693* (2013.01)

(58) Field of Classification Search
CPC . C23C 14/083; C23C 14/086; C23C 14/3414; H01J 34/3426
USPC ........................................ 204/298.12, 298.13
See application file for complete search history.

(56) References Cited

FOREIGN PATENT DOCUMENTS

| | | |
|---|---|---|
| JP | 2008-192721 A | 8/2008 |
| JP | 2008-199005 A | 8/2008 |
| JP | 2014-214359 A | 11/2014 |
| JP | 2015-107907 A | 6/2015 |
| WO | 2014/058019 A1 | 4/2014 |

\* cited by examiner

OXIDE SINTERED MATERIAL, METHOD OF PRODUCING OXIDE SINTERED MATERIAL, SPUTTERING TARGET, AND METHOD OF PRODUCING SEMICONDUCTOR DEVICE

TECHNICAL FIELD

The present invention relates to an oxide sintered material, a method of producing the oxide sintered material, a sputtering target, and a method of producing a semiconductor device.

The present application claims a priority based on Japanese Patent Application No. 2015-182931 filed on Sep. 16, 2015, the entire content of which is incorporated herein by reference.

BACKGROUND ART

Conventionally, an amorphous silicon (a-Si) film has been used mainly for a semiconductor film serving as a channel layer of a TFT (thin film transistor), which is a semiconductor device, in a liquid crystal display device, a thin film EL (electroluminescence) display device, an organic EL display device, or the like.

In recent years, as a material to replace a-Si, a complex oxide containing indium (In), gallium (Ga), and zinc (Zn), i.e., an In—Ga—Zn-based complex oxide (also referred to as "IGZO") has been drawing attention. Such an IGZO-based oxide semiconductor can be expected to have higher carrier mobility than that in a-Si.

For example, Japanese Patent Laying-Open No. 2008-199005 (Patent Document 1) discloses that an oxide semiconductor film mainly composed of IGZO is formed through a sputtering method employing an oxide sintered material as a target.

Japanese Patent Laying-Open No. 2008-192721 (Patent Document 2) discloses an oxide sintered material containing In and tungsten (W) as materials suitably used in forming an oxide semiconductor film by the sputtering method or the like.

Moreover, Japanese Patent Laying-Open No. 09-071860 (Patent Document 3) discloses an oxide sintered material containing In and Zn.

CITATION LIST

Patent Document

PTD 1: Japanese Patent Laying-Open No. 2008-199005
PTD 2: Japanese Patent Laying-Open No. 2008-192721
PTD 3: Japanese Patent Laying-Open No. 09-071860

SUMMARY OF INVENTION

An oxide sintered material according to one embodiment of the present invention is an oxide sintered material containing indium, tungsten, and zinc, the oxide sintered material including: a first crystal phase that is a main component of the oxide sintered material and includes a bixbyite type crystal phase; and a second crystal phase having a content of the zinc higher than a content of the zinc in the first crystal phase, the second crystal phase including particles having an average major axis size of not less than 3 μm and not more than 50 μm and having an average aspect ratio of not less than 4 and not more than 50.

A sputtering target according to another embodiment of the present invention includes the oxide sintered material according to the foregoing embodiment.

A method of producing a semiconductor device according to still another aspect of the present invention is a method of producing a semiconductor device including an oxide semiconductor film, the method including: preparing the sputtering target according to the foregoing embodiment; and forming the oxide semiconductor film by a sputtering method using the sputtering target.

A method of producing the oxide sintered material according to yet another embodiment of the present invention is a method of producing the oxide sintered material according to the foregoing embodiment, the method including: preparing a primary mixture of an indium oxide powder and a tungsten oxide powder; forming a calcinated powder by heating the primary mixture; preparing a secondary mixture of source powders including the calcinated powder; forming a molded body by molding the secondary mixture; and forming an oxide sintered material by sintering the molded body, forming the calcinated powder includes forming a powder of a complex oxide including indium and tungsten as the calcinated powder by heating the primary mixture at a temperature of not less than 700° C. and less than 1400° C. in an oxygen-containing atmosphere.

A method of producing an oxide sintered material according to further another embodiment of the present invention is a method of producing the oxide sintered material according to the foregoing embodiment, the method including: preparing a primary mixture of a zinc oxide powder and a tungsten oxide powder; forming a calcinated powder by heating the primary mixture; preparing a secondary mixture of source powders including the calcinated powder; forming a molded body by molding the secondary mixture; and forming an oxide sintered material by sintering the molded body, forming the calcinated powder includes forming a powder of a complex oxide including zinc and tungsten as the calcinated powder by heating the primary mixture at a temperature of not less than 550° C. and less than 1200° C. in an oxygen-containing atmosphere.

DESCRIPTION OF EMBODIMENTS

Technical Problem

Figure 1A:
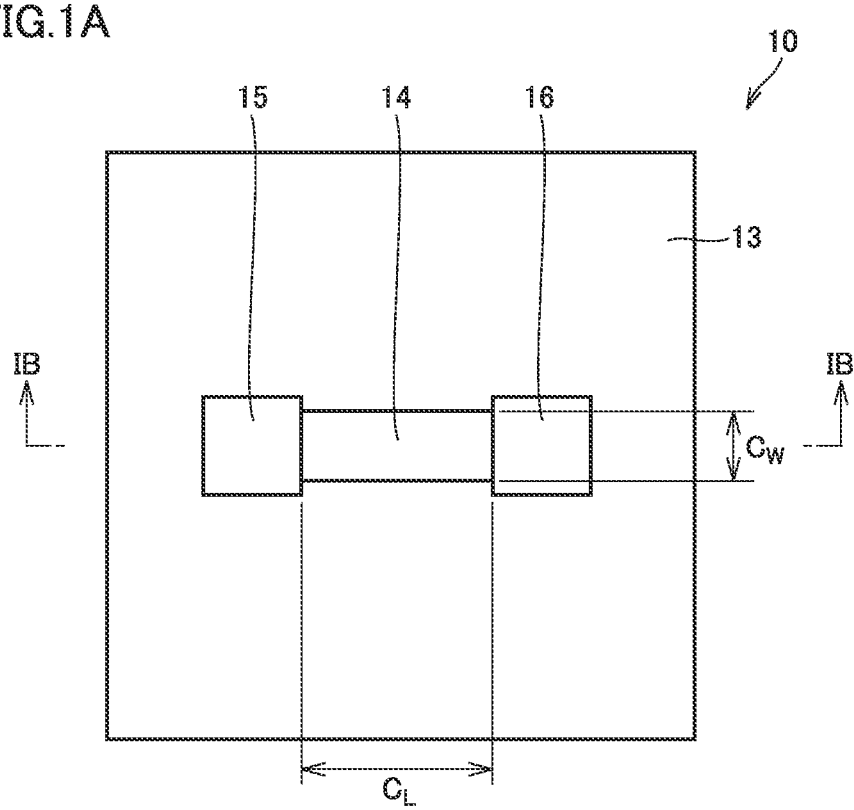
FIG. 1A is a schematic plan view showing an exemplary semiconductor device according to one embodiment of the present invention.

When an oxide sintered material is applied to a sputtering target, the sputtering target is generally processed into a desired shape through grinding, cutting, or the like. Since the oxide sintered material may be chipped or cracked during such processing, the oxide sintered material is desirably to have high mechanical strength.

Meanwhile, when forming a thin film using an oxide sintered material as a sputtering target, predetermined power is applied to the sputtering target. On this occasion, as the applied power is increased, the temperature of the sputtering target is increased, with the result that the oxide sintered material is cracked due to thermal fatigue or thermal expansion difference between the oxide sintered material and a copper backing plate having the oxide sintered material attached thereon. Accordingly, the oxide sintered material may become unusable as a sputtering target. In order to increase the applied voltage without causing a crack as described above, it is required to: increase the mechanical strength of the oxide sintered material to avoid cracking of the oxide sintered material even under application of stress; and increase thermal conductivity of the oxide sintered material to improve efficiency of water-cooling via the copper backing plate.

In view of the above, it is an object to provide: an oxide sintered material that can exhibit high mechanical strength and high thermal conductivity; a method of producing the oxide sintered material; a sputtering target including the oxide sintered material; and a method of producing a semiconductor device including an oxide semiconductor film formed using the sputtering target.

Advantageous Effects of Invention

According to the description above, there can be provided: an oxide sintered material that can exhibit high mechanical strength and high thermal conductivity; and a method of producing the oxide sintered material. Moreover, according to the description above, there can be provided a semiconductor device having both high field effect mobility and high reliability.

DESCRIPTION OF EMBODIMENTS OF THE PRESENT INVENTION

First, embodiments of the present invention are listed and described.

[1] An oxide sintered material according to one embodiment of the present invention is an oxide sintered material containing indium (In), tungsten (W) and zinc (Zn), the oxide sintered material including: a first crystal phase that is a main component of the oxide sintered material and includes a bixbyite type crystal phase; and a second crystal phase having a content of the zinc higher than a content of the zinc in the first crystal phase, the second crystal phase including particles having an average major axis size of not less than 3 μm and not more than 50 μm and having an average aspect ratio of not less than 4 and not more than 50. The second crystal phase is included in a portion of the oxide sintered material. The oxide sintered material of the present embodiment can exhibit high mechanical strength and high thermal conductivity. Moreover, the oxide sintered material of the present embodiment can exhibit a high apparent density (which means an apparent density after sintering and is also referred to as "sintered density") even with a relatively low sintering temperature. The oxide sintered material of the present embodiment can be suitably used as a sputtering target for forming an oxide semiconductor film (for example, oxide semiconductor film serving as a channel layer) included in a semiconductor device. According to the oxide sintered material of the present embodiment, a semiconductor device having high field effect mobility and high reliability can be obtained.

[2] The oxide sintered material of the present embodiment can have a first diffraction peak at a location of more than 34.74 deg and less than 34.97 deg of 2θ in X-ray diffraction, and can have a second diffraction peak at a location of more than 31.77 deg and less than 32.00 deg of 2θ, and in this case, a ratio Ia/Ib of a peak intensity Ia of the first diffraction peak to a peak intensity Ib of the second diffraction peak is preferably not less than 0.05 and not more than 3. Ia/Ib falling within this range is advantageous in realizing an oxide sintered material having a high apparent density even with a relatively low sintering temperature and exhibiting high thermal conductivity, and also is advantageous in improving the field effect mobility and reliability of the semiconductor device.

[3] Preferably, the oxide sintered material of the present embodiment has an apparent density of more than 6.4 g/cm$^3$ and not more than 7.5 g/cm$^3$, a content (hereinafter, also referred to as "W content" of the oxide sintered material) of the tungsten relative to a total of the indium, the tungsten, and the zinc in the oxide sintered material is more than 0.5 atom % and not more than 5.0 atom %, a content (hereinafter, also referred to as "Zn content" of the oxide sintered material) of the zinc relative to the total of the indium, the tungsten, and the zinc in the oxide sintered material is not less than 1.2 atom % and less than 50 atom %, and an atomic ratio (hereinafter, also referred to as "Zn/W ratio" of the oxide sintered material) of the zinc to the tungsten in the oxide sintered material is more than 1.0 and less than 100. The apparent density falling within the above range is advantageous in using the oxide sintered material of the present embodiment as a sputtering target. The W content, Zn content, and Zn/W ratio falling within the above ranges are advantageous in realizing an oxide sintered material having a high apparent density even with a relatively low sintering temperature and exhibiting high thermal conductivity, and also is advantageous in improving the field effect mobility and reliability of the semiconductor device.

[4] A sputtering target according to another embodiment of the present invention includes the oxide sintered material according to the foregoing embodiment. Since the sputtering target of the present embodiment includes the oxide sintered material of the foregoing embodiment, the sputtering target is used suitably to form, by the sputtering method, an oxide semiconductor film of a semiconductor device having high field effect mobility and high reliability.

[5] A method of producing a semiconductor device according to still another embodiment of the present invention is a method of producing a semiconductor device including an oxide semiconductor film, the method including: preparing the sputtering target according to the foregoing embodiment; and forming the oxide semiconductor film by a sputtering method using the sputtering target. Since the semiconductor device obtained by the production method of the present embodiment includes the oxide semiconductor film formed by the sputtering method using the sputtering target of the above embodiment, high field effect mobility and high reliability can be exhibited. Although the semiconductor device described herein should not be limited particularly, a suitable example thereof is a TFT (thin film transistor) including, as a channel layer, the oxide semiconductor film formed by the sputtering method using the sputtering target of the foregoing embodiment.

[6] Preferably in the method of producing the semiconductor device according to the present embodiment, a content (hereinafter, also referred to as "W content" of the oxide semiconductor film) of the tungsten relative to a total of the indium, the tungsten, and the zinc in the obtained oxide semiconductor film is more than 0.5 atom % and not more than 5.0 atom %, a content (hereinafter, also referred to as "Zn content" of the oxide semiconductor film) of the zinc relative to the total of the indium, the tungsten, and the zinc in the oxide semiconductor film is not less than 1 atom % and less than 50 atom %, and an atomic ratio (hereinafter, also referred to as "Zn/W ratio" of the oxide semiconductor film) of the zinc to the tungsten in the oxide semiconductor film is more than 1.0 and less than 100. Since the semiconductor device obtained by the production method of the present embodiment includes the oxide semiconductor film formed using the sputtering target of the above embodiment, high field effect mobility and high reliability can be exhibited.

[7] In the method of producing the semiconductor device according to the present embodiment, the obtained oxide semiconductor film can be composed of at least one of a nano crystal oxide and an amorphous oxide. This is advantageous in improving field effect mobility and reliability in a semiconductor device including the oxide semiconductor film as a channel layer, for example.

[8] A method of producing an oxide sintered material according to yet another embodiment of the present invention is a method of producing the oxide sintered material according to the foregoing embodiment, the method including: preparing a primary mixture of an indium oxide powder and a tungsten oxide powder; forming a calcinated powder by heating the primary mixture; preparing a secondary mixture of source powders including the calcinated powder; forming a molded body by molding the secondary mixture; and forming an oxide sintered material by sintering the molded body, forming the calcinated powder includes forming a powder of a complex oxide including indium and tungsten as the calcinated powder by heating the primary mixture at a temperature of not less than 700° C. and less than 1400° C. in an oxygen-containing atmosphere. According to the method of producing the oxide sintered material in the present embodiment, there can be obtained relatively readily an oxide sintered material having high mechanical strength and thermal conductivity or having a high apparent density even with a relatively low sintering temperature in addition to the high mechanical strength and thermal conductivity.

[9] In the method of producing the oxide sintered material according to the embodiment in [8], the complex oxide can include an $In_6WO_{12}$ type crystal phase. This is advantageous in obtaining an oxide sintered material having high apparent density and mechanical strength as well as high thermal conductivity.

[10] A method of producing the oxide sintered material according to further another embodiment of the present invention is a method of producing the oxide sintered material according to the foregoing embodiment, the method including: preparing a primary mixture of a zinc oxide powder and a tungsten oxide powder; forming a calcinated powder by heating the primary mixture; preparing a secondary mixture of source powders including the calcinated powder; forming a molded body by molding the secondary mixture; and forming an oxide sintered material by sintering the molded body, forming the calcinated powder includes forming a powder of a complex oxide including zinc and tungsten as the calcinated powder by heating the primary mixture at a temperature of not less than 550° C. and less than 1200° C. in an oxygen-containing atmosphere. According to the method of producing the oxide sintered material in the present embodiment, there can be obtained relatively readily an oxide sintered material having high mechanical strength and thermal conductivity or having a high apparent density even with a relatively low sintering temperature in addition to the high mechanical strength and thermal conductivity.

[11] In the method of producing the oxide sintered material according to the embodiment in [10], the complex oxide can include a $ZnWO_4$ type crystal phase. This is advantageous in obtaining an oxide sintered material having high apparent density and mechanical strength as well as high thermal conductivity.

[12] In the method of producing the oxide sintered material according to the embodiments in [8] to [11], the tungsten oxide powder can include at least one of crystal phases selected from a group consisting of a $WO_3$ crystal phase, a $WO_2$ crystal phase, and a $WO_{2.72}$ crystal phase. This is advantageous in obtaining an oxide sintered material having high apparent density and mechanical strength as well as high thermal conductivity.

[13] In the method of producing the oxide sintered material according to the embodiments in [8] to [12], the tungsten oxide powder can have a median particle size d50 of not less than 0.1 µm and not more than 4 µm. This is advantageous in obtaining an oxide sintered material having high apparent density and mechanical strength as well as high thermal conductivity.

DETAILS OF EMBODIMENTS OF THE PRESENT INVENTION

First Embodiment: Oxide Sintered Material

An oxide sintered material of the present embodiment is an oxide sintered material containing indium (In), tungsten (W), and zinc (Zn). The oxide sintered material of the present embodiment includes: a first crystal phase that is a main component of the oxide sintered material and includes a bixbyite type crystal phase; and a second crystal phase having a content of the zinc higher than a content of the zinc in the first crystal phase, the second crystal phase including particles having an average major axis size of not less than 3 µm and not more than 50 µm and having an average aspect ratio of not less than 4 and not more than 50. The second crystal phase is included in a part of the oxide sintered material. The oxide sintered material of the present embodiment can exhibit high mechanical strength and high thermal conductivity. The oxide sintered material of the present embodiment can be used suitably as a sputtering target for forming an oxide semiconductor film (for example, an oxide semiconductor film serving as a channel layer) of a semiconductor device. According to the oxide sintered material of the present embodiment, a semiconductor device having high field effect mobility and high reliability can be obtained.

(1) First Crystal Phase

The first crystal phase is a below-described high-content indium type crystal phase, which is a main component of the oxide sintered material and includes at least the bixbyite type crystal phase. In the present specification, the term "bixbyite type crystal phase" is a general term encompassing a bixbyite crystal phase and a phase in which at least one of metallic elements other than In is included in at least a part of the bixbyite crystal phase and which has the same crystal structure as that of the bixbyite crystal phase. The bixbyite crystal phase is one of crystal phases of indium oxide ($In_2O_3$), represents a crystal structure defined in 6-0416 of the JCPDS card, and is also referred to as "C type rare earth oxide phase" (or "C rare earth structure phase").

The inclusion of the bixbyite type crystal phase can be identified through X-ray diffraction. Specifically, existence of the bixbyite type crystal phase is confirmed through X-ray diffraction, whereby each plane spacing can be measured. For measurement conditions for the X-ray diffraction, conditions indicated in "(3) X-Ray Diffraction Characteristics of Oxide Sintered Material" below are employed.

The expression "the first crystal phase including the bixbyite type crystal phase is the main component of the oxide sintered material" is intended to mean that a ratio (high-content indium type crystal phase ratio) of the high-content indium type crystal phase having a high content of In, such as the bixbyite type crystal phase or an indium tungstate compound crystal phase, is not less than 50% in the oxide sintered material.

The "high-content indium type crystal phase ratio" is measured as follows. First, a sample is extracted from a portion of the oxide sintered material, and a surface of this sample is polished to smooth a surface thereof. Next, SEM-EDX (Scanning Secondary Electron Microscope with Energy Dispersive X-ray Fluorescent Emission Spectrometer) is employed to observe the surface of the sample by SEM (Scanning Secondary Electron Microscope) and analyze a composition ratio of metallic elements in each crystal particle by EDX (Energy Dispersive X-ray Fluorescent Emission Spectrometer). Then, the crystal particles are classified into groups based on a tendency of the composition ratios of the metallic elements of those crystal particles. Specifically, the crystal particles are classified into: a group A of crystal particles having a higher Zn content (content (atom %) of Zn relative to a total of In, W, and Zn) than that of a below-described group B; and group B (high-content indium type crystal phase) of crystal particles having a very low Zn content or containing no Zn and having a higher In content (content (atom %) of In relative to the total of In, W, and Zn) than that of group A. In doing so, the crystal particles of group B are determined as the first crystal phase ($In_2O_3$ phase or the like). The first crystal phase can include not only the bixbyite type crystal phase but also the indium tungstate compound crystal phase or the like. Further, the "high-content indium type crystal phase ratio" in the oxide sintered material is defined as a ratio (percentage) of an area of the high-content indium type crystal phase (group B) in the surface of the oxide sintered material for which the above-described measurement has been performed. In the oxide sintered material according to the present embodiment thus including the first crystal phase (high-content indium type crystal phase) as the main component, the high-content indium type crystal phase ratio in accordance with this definition is not less than 50%.

In at least a part of the first crystal phase, W and/or Zn may be dissolved in a solid state. This is advantageous in realizing an oxide sintered material having high mechanical strength and exhibiting high thermal conductivity, and is also advantageous in improving field effect mobility and reliability of a semiconductor device including, as a channel layer, an oxide semiconductor film formed using the oxide sintered material.

The expression "W and/or Zn are dissolved in at least a part of the first crystal phase in a solid state" is intended to mean that: W and/or Zn are substitutionally dissolved in a solid state in at least a part of the crystal lattice of the first crystal phase; W and/or Zn are interstitially dissolved in a solid state in the crystal lattice; and W and/or Zn are substitutionally and interstitially dissolved in a solid state.

When W and/or Zn are dissolved in a solid state in at least a part of the bixbyite type crystal phase included in the first crystal phase in the oxide sintered material according to the present embodiment, the plane spacing becomes wider or narrower than the plane spacing defined in 6-0416 of the JCPDS card. In the X-ray diffraction, a peak location is shifted to the high angle side or is shifted to the low angle side. When such a peak shift is confirmed and existence of a region having In and W and/or Zn mixed therein is confirmed through a surface analysis using SEM-EDX (Scanning Secondary Electron Microscope with Energy Dispersive X-Ray Fluorescent Emission Spectrometer) or TEM-EDX (Transmission Type Secondary Electron Microscope with Energy Dispersive X-Ray Fluorescent Emission Spectrometer), it can be determined that W and/or Zn are dissolved in a solid state in the bixbyite type crystal phase included in the first crystal phase.

Alternatively, when the existence of In and W and/or Zn is confirmed by identifying elements therein through ICP (Inductively Coupled Plasma) mass spectrometry, SEM-EDX, or other element identification methods but oxide(s) of W and/or Zn are not confirmed in the X-ray diffraction, it can also be determined that W and/or Zn are dissolved in a solid state in the bixbyite type crystal phase included in the first crystal phase.

The first crystal phase can further include the indium tungstate compound crystal phase. The further inclusion of the indium tungstate compound crystal phase is advantageous in realizing an oxide sintered material having high mechanical strength and exhibiting high thermal conductivity, and is also advantageous in improving field effect mobility and reliability of a semiconductor device including, as a channel layer, an oxide semiconductor film formed using the oxide sintered material. The indium tungstate compound crystal phase is a phase that can be included in a part of the oxide sintered material.

In the present specification, the "indium tungstate compound crystal phase" is a crystal phase having In, W, and O as its main components. Examples thereof include an $In_6WO_{12}$ crystal phase, an $InW_3O_9$ phase, and the like. The $In_6WO_{12}$ crystal phase is an indium tungstate compound crystal phase having a trigonal crystal structure and a crystal structure defined in 01-074-1410 of the JCPDS card. As long as the crystal structure is exhibited, oxygen may lack or a metal may be dissolved in a solid state to result in a change in lattice constant. The $InW_3O_9$ phase is an indium tungstate compound crystal phase having a hexagonal crystal structure and a crystal structure defined in 33-627 of the JCPDS card. As long as the crystal structure is exhibited, oxygen may lack or a metal may be dissolved in a solid state to result in a change in lattice constant.

The existence of the indium tungstate compound crystal phase is confirmed by obtaining a peak belonging to the indium tungstate compound crystal phase in the X-ray diffraction.

(2) Second Crystal Phase

The oxide sintered material of the present embodiment further includes the second crystal phase having a higher Zn content (content (atom %) of Zn relative to the total of In, W, and Zn) than that of the first crystal phase. The second crystal phase is a phase included in a part of the oxide sintered material. The second crystal phase preferably has a Zn content of not less than 50 atom %. In order to realize an oxide sintered material having high mechanical strength and exhibiting high thermal conductivity, the Zn content of the second crystal phase is more preferably not less than 60 atom %, and is further preferably not less than 70 atom %. The Zn content of the second crystal phase may be 100 atom %.

The existence of the second crystal phase can be confirmed through the surface analysis using SEM-EDX performed when determining the high-content indium type crystal phase ratio, and the second crystal phase is represented by a crystal phase including the crystal particles of group A classified as a result of the surface analysis.

The second crystal phase can be a hexagonal wurtzite type crystal phase, a zinc tungstate compound crystal phase, a hexagonal lamellar crystal phase, a combination thereof, or the like, for example. In the present specification, the term "hexagonal wurtzite type crystal phase" is a general term encompassing a hexagonal wurtzite crystal phase and a phase in which at least one of metallic elements other than Zn is included in at least a part of the hexagonal wurtzite crystal phase and which has the same crystal structure as that of the hexagonal wurtzite crystal phase. The hexagonal wurtzite crystal phase is one of crystal phases of zinc oxide (ZnO), and is a crystal structure represented by a space group P63mc and a space group No. 186 and defined in 01-079-0207 of the JCPDS card. The existence of the hexagonal wurtzite type crystal phase can be confirmed by obtaining a peak belonging to the hexagonal wurtzite type crystal phase in the X-ray diffraction.

The hexagonal wurtzite type crystal phase includes ZnO as its main component, and W and/or In may be substitutionally and/or interstitially dissolved in a solid state in at least a part of the hexagonal wurtzite type crystal phase. In order to confirm that they are dissolved in a solid state, a method employing X-ray diffraction, SEM-EDX, or TEM-EDX is applicable as with the above-described method of confirming whether or not "W and/or Zn are dissolved in a solid state in at least a part of the first crystal phase".

In the present specification, the term "zinc tungstate compound crystal phase" is a crystal phase having Zn, W, and O as its main component. An example thereof is a $ZnWO_4$ type crystal phase. The term "$ZnWO_4$ type crystal phase" is a general term encompassing a $ZnWO_4$ crystal phase and a phase in which at least one of elements other than Zn and W is included in at least a part of the $ZnWO_4$ crystal phase and which has the same crystal structure as that of the $ZnWO_4$ crystal phase. The $ZnWO_4$ crystal phase is a zinc tungstate compound crystal phase having a crystal structure represented by a space group P12/c1(13) and having a crystal structure defined in 01-088-0251 of the JCPDS card. As long as the crystal structure is exhibited, oxygen may lack or a metal may be dissolved in a solid state to result in a change in lattice constant.

The existence of the zinc tungstate compound crystal phase can be confirmed by obtaining a peak belonging to the zinc tungstate compound crystal phase in the X-ray diffraction. Moreover, a ratio of the zinc tungstate compound crystal phase can be confirmed by the surface analysis employing SEM-EDX performed when determining the high-content indium type crystal phase ratio. Specifically, in group A classified as a result of the surface analysis, the zinc tungstate compound crystal phase is represented by crystal particles containing Zn and W, more typically, crystal particles in which Zn and W are mixed at a ratio such that the Zn content (content (atom %) of Zn relative to the total of In, W, and Zn) and the W content (content (atom %) of W relative to the total of In, W, and Zn) are close to those in the zinc tungstate compound crystal phase in the above-mentioned X-ray diffraction, thus confirming the ratio of the zinc tungstate compound crystal phase.

Examples of the hexagonal lamellar crystal phase can include $In_2O_3(ZnO)_5$ and the like. The existence of the hexagonal lamellar crystal phase, such as $In_2O_3(ZnO)_5$, can be confirmed by obtaining a peak belonging to the hexagonal lamellar crystal phase in the X-ray diffraction. W and/or In may be substitutionally and/or interstitially dissolved in a solid state in at least a part of the hexagonal lamellar crystal. In order to confirm that they are dissolved in a solid state, a method employing X-ray diffraction, SEM-EDX, or TEM-EDX is applicable as with the above-described method of confirming whether or not "W and/or Zn are dissolved in a solid state in at least a part of the first crystal phase".

As described above, the existence of the second crystal phase can be confirmed by the surface analysis employing SEM-EDX performed when determining the high-content indium type crystal phase ratio, and the second crystal phase is represented by a crystal phase including the crystal particles of group A classified as a result of the surface analysis. Specifically, it can be determined that the second crystal phase is included when there is a region having a Zn content higher than that of the first crystal phase. The second crystal phase may be a crystal phase other than the above-described hexagonal wurtzite type crystal phase, zinc tungstate compound crystal phase, and hexagonal lamellar crystal phase.

Preferably, the crystal particles included in the second crystal phase have an average major axis size of not less than 3 μm and not more than 50 μm, and have an average aspect ratio of not less than 4 and not more than 50. This is advantageous in realizing an oxide sintered material having high mechanical strength and exhibiting high thermal conductivity, and is also advantageous in improving field effect mobility and reliability of a semiconductor device including, as a channel layer, an oxide semiconductor film formed using the oxide sintered material.

The average major axis size and the average aspect ratio are determined as follows. When a reflection electron image is used for the SEM observation in the surface analysis employing SEM-EDX performed when determining the high-content indium type crystal phase ratio, group A representing the second crystal phase is observed in gray deeper than group B classified as the first crystal phase. The major axis length and minor axis length of each of the crystal particles included in the second crystal phase observed in the deeper gray in the reflection electron image captured in ×500 are measured to calculate an aspect ratio, which is a ratio (major axis length/minor axis length) of the major axis length to the minor axis length. The minor axis length is measured at a location ½ of the major axis length. It should be noted that the second crystal phase to be measured does not need to be a single crystal and may include particles of aggregated polycrystals, and a region of the independent second crystal phase surrounded by the first crystal phase is measured as one particle.

100 minor axis lengths and 100 major axis lengths from the second crystal phase are measured at random in a field of view of 170 μm×250 μm in the reflection electron image captured in ×500 in the SEM observation, and an average value of 20 major axis lengths from the third largest to twenty second largest major axis lengths is regarded as the average major axis size.

Similarly, 100 minor axis lengths and 100 major axis lengths from the second crystal phase are measured at random in the field of view of 170 μm×250 μm in the reflection electron image captured in ×500 in the SEM observation so as to calculate an aspect ratio (major axis length/minor axis length) of each particle in the second crystal phase. Then, an average value of 20 aspect ratios from the third largest to twenty second aspect ratios is regarded as the average aspect ratio.

The average major axis size of not less than 3 μm and not more than 50 μm is advantageous in improving mechanical strength and thermal conductivity of the oxide sintered material. When the average major axis size is less than 3 μm, sufficiently high mechanical strength and thermal conductivity are not obtained. When the average major axis size is more than 50 μm, no sufficiently high mechanical strength tends to be obtained. The average major axis size is preferably not less than 10 μm and is more preferably not less than 15 μm. Moreover, the average major axis size is preferably not more than 40 μm, and is more preferably not more than 30 μm.

The average aspect ratio of not less than 4 and not more than 50 is advantageous in improving mechanical strength and is also advantageous in improving thermal conductivity. When the average aspect ratio is less than 4, sufficiently high mechanical strength and thermal conductivity are not obtained. When the average aspect ratio is more than 50, a sufficiently high apparent density is not obtained, thus resulting in low mechanical strength. The average aspect ratio is preferably not less than 6, and is more preferably not less than 8. Moreover, the average aspect ratio is preferably not more than 40, and is more preferably not more than 30.

(3) X-Ray Diffraction Characteristics of Oxide Sintered Material

The oxide sintered material of the present embodiment has a first diffraction peak at a location of more than 34.74 deg and less than 34.97 deg of 2θ in the X-ray diffraction and has a second diffraction peak at a location of more than 31.77 deg and less than 32.00 deg of 2θ, and a ratio Ia/Ib of a peak intensity Ia of the first diffraction peak to a peak intensity Ib of the second diffraction peak is preferably not less than 0.05 and not more than 3. Ia/Ib falling within this range is advantageous in realizing an oxide sintered material having a high apparent density even with a relatively low sintering temperature and exhibiting high thermal conductivity, and is also advantageous in improving field effect mobility and reliability of a semiconductor device including, as a channel layer, an oxide semiconductor film formed using the oxide sintered material. The first diffraction peak and the second diffraction peak may be obtained from the same crystal phase. When the first diffraction peak and the second diffraction peak are not obtained from the same crystal phase, the crystal phase having the second diffraction peak may be $In_2O_3(ZnO)_5$, but it is not certain at present.

When Ia/Ib is less than 0.05, the thermal conductivity of the oxide sintered material obtained does not tend to be sufficiently high. In view of this, Ia/Ib is more preferably not less than 0.1 and is further preferably not less than 0.2. It is not easy to prepare an oxide sintered material having Ia/Ib of more than 3. In order to obtain high thermal conductivity, Ib/Ia is more preferably not more than 2.

The measurement of X-ray diffraction is performed under the following conditions or equivalent conditions.

(Measurement Conditions for X-Ray Diffraction)
θ-2θ method,
X-ray source: Cu Kα rays,
X-ray tube voltage: 45 kV,
X-ray tube current: 40 mA,
Step width: 0.03 deg,
Step time: 1 second/step,
Measurement range 2θ: 10 deg to 90 deg.

Peak intensities Ia and Ib in the X-ray diffraction are determined as follows. First, in a range of 2θ of not less than 32.15 deg and not more than 32.90 deg, an average value Iave of signal intensities I of the X-ray diffraction is calculated. Next, a signal intensity Ia' of the first diffraction peak and a signal intensity Ib' of the second diffraction peak are measured and peak intensity Ia of the first diffraction peak is determined from the following formula:

$$Ia=Ia'-Iave.$$

Similarly, peak intensity Ib of the second diffraction peak is determined from the following formula:

$$Ib=Ib'-Iave.$$

These calculations are intended to remove a background in the X-ray diffraction.

When there is no orientation in a sample, Ia/Ib indicates a value intrinsic to a material thereof; however, Ia/Ib may indicate a value different from the value intrinsic to the material thereof in the oxide sintered material of the present embodiment. In this case, it is considered that the second crystal phase has an orientation. Since the thermal conductivity and mechanical strength of the oxide sintered material can differ depending on crystal orientations, Ia/Ib of not less than 0.05 and not more than 3 is advantageous in realizing high thermal conductivity and high mechanical strength in the oxide sintered material of the present embodiment.

(4) Apparent Density, W Content, Zn Content, and Zn/W Ratio of Oxide Sintered Material The oxide sintered material of the present embodiment preferably has an apparent density of more than 6.4 g/cm³ and not more than 7.5 g/cm³. Moreover, in the oxide sintered material of the present embodiment, a relative density, which is a ratio (apparent density/theoretical density) of the apparent density to a theoretical density thereof, is preferably not less than 94%. The theoretical density of the oxide sintered material of the present embodiment depends on the In content, the W content, and the Zn content, and has a value falling within a range of 6.8 g/cm³ to 7.5 g/cm³ for calculation.

The apparent density falling within the above range is advantageous in using the oxide sintered material of the present embodiment as a sputtering target. When the oxide sintered material is used as a sputtering target, it is considered more desirable for the oxide sintered material to have a higher apparent density. A low apparent density of an oxide sintered material means that the oxide sintered material has a multiplicity of holes therein. During use of a sputtering target, a surface of the sputtering target is etched by argon ions. Hence, if there are holes in the oxide sintered material, these holes are exposed during film formation to release gas therein, with the result that the gas thus released from the target is mixed in an oxide semiconductor thin film to be deposited. Accordingly, film characteristics are deteriorated. Moreover, it is known that if the apparent density of the oxide sintered material is low, an In insulator referred to as "nodule" is generated on the target during the film formation to hinder favorable sputtering discharge. Also in view of this, it is desirable to increase the apparent density of the oxide sintered material.

The oxide sintered material of the present embodiment preferably has a W content of more than 0.5 atom % and not more than 5.0 atom %, a Zn content of not less than 1.2 atom % and less than 50 atom %, and a Zn/W ratio of more than 1.0 and less than 100. The W content, Zn content, and Zn/W ratio falling within the above respective ranges are advantageous in realizing an oxide sintered material having a high apparent density even with a relatively low sintering temperature and exhibiting high thermal conductivity, and are also advantageous in improving field effect mobility and reliability of a semiconductor device including, as a channel layer, an oxide semiconductor film formed using the oxide sintered material.

In order to improve the field effect mobility and reliability, the W content of the oxide sintered material is more preferably not less than 0.6 atom % and not more than 3 atom %, and is further preferably not more than 2 atom %. If the W content of the oxide sintered material is not more than 0.5 atom %, reliability becomes low in a semiconductor device including, as a channel layer, an oxide semiconductor film formed using the oxide sintered material. If the W content of the oxide sintered material is more than 5 atom %, field effect mobility becomes low in a semiconductor device including, as a channel layer, an oxide semiconductor film formed using a sputtering target including such an oxide sintered material.

Thus, preferably, the range of the W content of the oxide sintered material is determined depending on the characteristics of the semiconductor device including, as a channel layer, the oxide semiconductor film formed using the oxide sintered material of the present embodiment, and the W content of the oxide semiconductor film normally indicates a value according to the W content of the oxide sintered material. However, the W content of the oxide semiconductor film does not necessarily need to be the same as the W content of the oxide sintered material.

Generally, an oxide sintered material obtained by mixing indium oxide with tungsten oxide has a low apparent density. Although the apparent density can be increased by containing Zn and increasing contact points between W and Zn, a desired W content determined in consideration of the characteristics of the semiconductor device is small to fall within a range of more than 0.5 atom % and not more than 5.0 atom %, so that it is preferable to increase the Zn content in order to realize an oxide sintered material having a higher apparent density. When the Zn content is less than 1.2 atom %, it tends to be difficult to obtain a sufficiently high apparent density. When the Zn content is not less than 50 atom %, electric resistance of the oxide sintered material becomes high, with the result that it tends to be difficult to perform sputtering under application of DC voltage. Moreover, the crystal particles included in the second crystal phase are connected to one another, with the result that it becomes difficult to confirm, by measurement, whether or not the average major axis size and/or the average aspect ratio fall within the above predetermined range(s). When the Zn/W ratio is not more than 1.0, it tends to be difficult to obtain a sufficiently high apparent density. When the Zn/W ratio is not less than 100, electric resistance in the oxide sintered material becomes high, with the result that it tends to be difficult to perform sputtering under application of DC voltage. The contents of In, Zn, and W in the oxide sintered material can be measured by ICP mass analysis.

It should be noted that the oxide sintered material of the present embodiment may further contain zirconium (Zr). The content of zirconium is not less than $1 \times 10^{17}$ atms/cm$^3$ and not more than $1 \times 10^{20}$ atms/cm$^3$, for example. Although Zr is an element that can be mixed in the production process of the oxide sintered material, Zr does not prevent achievement of high apparent density and high mechanical strength. The existence and content of Zr can be confirmed by a secondary ion mass spectrometer.

(5) Application of Oxide Sintered Material to Sputtering Target

The oxide sintered material of the present embodiment can be suitably used as a sputtering target. The term "sputtering target" refers to a source material in a sputtering method. The sputtering method refers to a method of forming a film composed of atoms from a sputtering target disposed to face a substrate in a film formation chamber in the following manner: voltage is applied to the sputtering target and a surface of the target is sputtered by noble gas ions to release atoms of the target and accordingly deposit them on the substrate.

Because current flows due to the application of voltage, the sputtering target is heated. Hence, the oxide sintered material is generally attached to a copper backing plate using an indium metal and is generally water-cooled from the copper side. As the applied power to the sputtering target is higher, the heating temperature of the sputtering target also becomes higher.

In order to more improve the reliability in the semiconductor device including the oxide semiconductor film formed by the sputtering method using the oxide sintered material as the sputtering target, it is preferable to increase the applied power to the sputtering target during the sputtering. However, such increased applied power leads to a high heating temperature of the sputtering target, with the result that tensile stress may be applied to the oxide sintered material to crack the oxide sintered material during the film formation due to a thermal expansion difference between the copper backing plate and the oxide sintered material. In order to suppress such cracking, it is required to increase cooling efficiency of the water cooling by increasing the thermal conductivity of the oxide sintered material and to reduce the heating temperature of the oxide sintered material even under application of the same power. Moreover, it is required to reduce generation of cracks even under application of the same tensile stress by increasing the mechanical strength of the oxide sintered material. The oxide sintered material of the present embodiment is an oxide sintered material particularly having the predetermined average major axis size and average aspect ratio and therefore having high thermal conductivity and mechanical strength in conformity with such requirements.

Second Embodiment: Method of Producing Oxide Sintered Material

One of methods of producing an oxide sintered material according to the present embodiment is a method of producing the oxide sintered material according to the first embodiment, and includes the steps of: preparing a primary mixture of a zinc oxide powder and a tungsten oxide powder; forming a calcinated powder by heating the primary mixture; preparing a secondary mixture of source powders including the calcinated powder; forming a molded body by molding the secondary mixture; and forming the oxide sintered material by sintering the molded body. The step of forming the calcinated powder includes forming a powder of a complex oxide including Zn and W as the calcinated powder by heating the primary mixture at a temperature of not less than 550° C. and less than 1200° C. in an oxygen-containing atmosphere.

According to the production method above, since the step of forming the calcinated powder includes forming the complex oxide powder including Zn and W as the calcinated powder by heating the primary mixture of the zinc oxide powder and the tungsten oxide powder at a temperature of not less than 550° C. and less than 1200° C. in the oxygen-containing atmosphere, an oxide sintered material can be obtained which has high mechanical strength and thermal conductivity and which can be used suitably as a sputtering target. Moreover, according to the production method above, an oxide sintered material having a high apparent density can be obtained even with a relatively low sintering temperature. Regarding the complex oxide, oxygen may lack or a metal may be substituted.

When the heating temperature is less than 550° C., the complex oxide powder including Zn and W is not obtained. When the heating temperature is not less than 1200° C., the complex oxide powder including Zn and W is decomposed and scattered or the particle size of the complex oxide powder tends to be too large to such an extent that it is not suitable for use.

Moreover, since the complex oxide powder including Zn and W and serving as the calcinated powder is formed by the heating, field effect mobility and reliability can be more effectively improved in the semiconductor device including, as a channel layer, the oxide semiconductor film formed using the sputtering target including the oxide sintered material obtained.

The complex oxide including Zn and W preferably includes a $ZnWO_4$ type crystal phase. Accordingly, the apparent density and mechanical strength of the oxide sintered material can be improved more effectively. The $ZnWO_4$ type crystal phase is a zinc tungstate compound crystal phase having a crystal structure represented by a space group P12/c1(13) and having a crystal structure defined in 01-088-0251 of the JCPDS card. As long as the crystal structure is exhibited, oxygen may lack or a metal may be dissolved in a solid state to result in a change in lattice constant. The $ZnWO_4$ type crystal phase is identified by X-ray diffraction measurement.

Moreover, another one of the methods of producing the oxide sintered material according to the present embodiment is a method of producing the oxide sintered material according to the first embodiment, and includes the steps of: preparing a primary mixture of an indium oxide powder and a tungsten oxide powder; forming a calcinated powder by heating the primary mixture; preparing a secondary mixture of source powders including the calcinated powder; forming a molded body by molding the secondary mixture; and forming an oxide sintered material by sintering the molded body. The step of forming the calcinated powder includes forming a powder of a complex oxide including In and W as the calcinated powder by heating the primary mixture at a temperature of not less than 700° C. and less than 1400° C. in an oxygen-containing atmosphere.

According to the production method above, since the step of forming the calcinated powder includes forming the complex oxide powder including In and W as the calcinated powder by heating the primary mixture of the indium oxide powder and the tungsten oxide powder at a temperature of not less than 700° C. and less than 1400° C. in the oxygen-containing atmosphere, an oxide sintered material can be obtained which has high mechanical strength and thermal conductivity and which can be used suitably as a sputtering target. Moreover, according to the production method above, an oxide sintered material having a high apparent density can be obtained even with a relatively low sintering temperature. Regarding the complex oxide, oxygen may lack or a metal may be substituted.

When the heating temperature is less than 700° C., the complex oxide powder including In and W is not obtained. When the heating temperature is not less than 1400° C., the complex oxide powder including In and W is decomposed and scattered or the particle size of the complex oxide powder tends to be too large to such an extent that it is not suitable for use.

Moreover, since the complex oxide powder including In and W as the calcinated powder is formed by the heating, the field effect mobility and reliability can be more effectively improved in the semiconductor device including, as a channel layer, the oxide semiconductor film formed using the sputtering target including the oxide sintered material obtained.

The complex oxide including In and W preferably includes an $In_6WO_{12}$ type crystal phase. Accordingly, the apparent density and mechanical strength of the oxide sintered material can be improved more effectively. The $In_6WO_{12}$ crystal phase is an indium tungstate compound crystal phase having a trigonal crystal structure and having a crystal structure defined in 01-074-1410 of the JCPDS card. As long as the crystal structure is exhibited, oxygen may lack or a metal may be dissolved in a solid state to result in a change in lattice constant. It should be noted that since an indium tungstate compound crystal phase disclosed in Japanese Patent Laying-Open No. 2004-091265 is an $InW_3O_9$ crystal phase, has a hexagonal crystal structure, and has a crystal structure defined in 33-627 of the JCPDS card, the crystal structure thereof is different from that of the $In_6WO_{12}$ crystal phase. The $In_6WO_{12}$ type crystal phase is identified by X-ray diffraction measurement.

It has been known that W hinders sintering of indium oxide, which accordingly hinders achievement of a high apparent density of the oxide sintered material. However, according to the production method of the present invention, an oxide sintered material having a high apparent density can be obtained even with a low sintering temperature by using the complex oxide powder including In and W, and/or the complex oxide powder including Zn and W, and/or the complex oxide powder including In and Zn. Moreover, the obtained oxide sintered material has high thermal conductivity.

In order to increase the apparent density of the oxide sintered material including In, W, and Zn, it is effective that the complex oxide including Zn and W having low melting points is present during the sintering. To attain this, it is preferable to increase contact points between the tungsten oxide and the zinc oxide during the sintering and to form the complex oxide including Zn and W. Therefore, in order to obtain a high apparent density even with a low sintering temperature or obtain higher mechanical strength, it is preferable to employ: a method of using, for the production process, the complex oxide powder including Zn and W synthesized in advance; and/or a method of increasing the contact points with Zn by using the complex oxide powder including In and W synthesized in advance. These methods may be used solely or in combination. For example, both the method of using, for the production process, the complex oxide powder including Zn and W synthesized in advance, and the method of using the complex oxide powder including indium and tungsten synthesized in advance may be used. In order to realize high apparent density with a low sintering temperature, high thermal conductivity, and high mechanical strength, it is more preferable to use at least the method of using, for the production process, the complex oxide powder including Zn and W synthesized in advance.

The tungsten oxide powder used for the production of the oxide sintered material preferably includes at least one selected from a group consisting of a $WO_3$ crystal phase, a $WO_2$ crystal phase, and a $WO_{2.72}$ crystal phase. This leads to more effective improvement of the apparent density and mechanical strength of the oxide sintered material, and is also advantageous in improving the field effect mobility and reliability.

Moreover, the tungsten oxide powder preferably has a median particle size d50 of not less than 0.1 μm and not more than 4 μm, more preferably, not less than 0.2 μm and not more than 2 μm, and further preferably not less than 0.3 μm and not more than 1.5 μm. Accordingly, the apparent density and mechanical strength of the oxide sintered material can be improved more effectively. Median particle size d50 is determined by BET specific surface area measurement. When median particle size d50 is less than 0.1 μm, it is difficult to handle the powder, with the result that it tends to be difficult to uniformly mix the zinc oxide powder with the tungsten oxide powder or mix the indium oxide powder with the tungsten oxide powder.

Meanwhile, median particle size d50 of more than 4 μm leads to a large particle size of the complex oxide powder including Zn and W obtained by heating at a temperature of not less than 550° C. and less than 1200° C. in the oxygen-containing atmosphere after mixing with the zinc oxide powder, with the result that it tends to be difficult to improve the apparent density and mechanical strength of the oxide sintered material. Similarly, median particle size d50 of more than 4 μm leads to a large particle size of the complex oxide powder including In and W obtained by heating at a temperature of not less than 700° C. and less than 1400° C. in the oxygen-containing atmosphere after mixing with the indium oxide powder, with the result that it tends to be difficult to improve the apparent density and mechanical strength of the oxide sintered material.

Although the method of producing the oxide sintered material according to the present embodiment should not be particularly limited, the method of producing the oxide sintered material according to the present embodiment includes, for example, the following steps in order to form the oxide sintered material of the first embodiment efficiently.

(1) Step of Preparing Source Powder

As the source powders of the oxide sintered material, oxide powders of metallic elements to be included in the oxide sintered material are prepared, such as an indium oxide powder (for example, $In_2O_3$ powder), a tungsten oxide powder (for example, $WO_3$ powder, $WO_{2.72}$ powder, or $WO_2$ powder), and a zinc oxide powder (for example, ZnO powder). In order to improve the field effect mobility and reliability of the semiconductor device, it is preferable to use, as the tungsten oxide powder of the source materials, not only the $WO_3$ powder but also a powder having a chemical composition lacking oxygen as compared with the $WO_3$ powder, such as the $WO_{2.72}$ powder or the $WO_2$ powder. In view of this, at least one of the $WO_{2.72}$ powder and the $WO_2$ powder is more preferably used as at least a part of the tungsten oxide powder. The source powders preferably have a high purity of not less than 99.9 mass % in order to prevent unintended introduction of a metallic element and Si into the oxide sintered material and to obtain a stable physical property.

As described above, median particle size d50 of the tungsten oxide powder is preferably not less than 0.1 μm and not more than 4 μm in order to improve the apparent density and mechanical strength of the oxide sintered material.

(2) Step of Preparing Primary Mixture (2-1) Step of Preparing Primary Mixture of Zinc Oxide Powder and Tungsten Oxide Powder The zinc oxide powder and tungsten oxide powder of the source powder are mixed (or pulverized and mixed). In doing so, if it is desired to obtain the $ZnWO_4$ type crystal phase as the crystal phase of the oxide sintered material, the tungsten oxide powder and the zinc oxide powder are mixed at a molar ratio of 1:1. On the other hand, if it is desired to obtain the $Zn_2W_3O_8$ type crystal phase, the tungsten oxide powder and the zinc oxide powder are mixed at a molar ratio of 3:2. As described above, in order to more effectively improve the apparent density and mechanical strength of the oxide sintered material and improve the field effect mobility and reliability of the semiconductor device, the oxide sintered material preferably includes the $ZnWO_4$ type phase. A method of mixing the tungsten oxide powder with the zinc oxide powder should not be particularly limited and may be a dry type method or a wet type method. Specifically, the tungsten oxide powder and the zinc oxide powder are pulverized and mixed using a ball mill, a planetary ball mill, a bead mill, or the like. In this way, the primary mixture of the source powder is obtained. For drying of the mixture obtained using the wet type pulverization and mixing method, a drying method such as natural drying or a spray dryer can be used.

(2-2) Step of Preparing Primary Mixture of Indium Oxide Powder and Tungsten Oxide Powder The indium oxide powder and tungsten oxide powder of the source powder are mixed (or pulverized and mixed). In doing so, if it is desired to obtain the $In_6WO_{12}$ type crystal phase as the crystal phase of the oxide sintered material, the tungsten oxide powder and the indium oxide powder are mixed at a molar ratio of 1:3. A method of mixing the tungsten oxide powder with the indium oxide powder should not be particularly limited, and may be the dry type method or the wet type method. Specifically, the tungsten oxide powder and the zinc oxide powder are pulverized and mixed using a ball mill, a planetary ball mill, a bead mill, or the like. In this way, the primary mixture of the source powder is obtained. For drying of the mixture obtained using the wet type pulverization and mixing method, a drying method such as natural drying or a spray dryer can be used.

(3) Step of Forming Calcinated Powder (3-1) Step of Forming Calcinated Powder of Tungstate Zinc Oxide The obtained primary mixture is heated (calcinated) to form the calcinated powder (complex oxide powder including Zn and W). The calcination temperature of the primary mixture is preferably less than 1200° C. to prevent the particle size of the calcinated powder from being too large and prevent decrease of the apparent density of the sintered material. In order to obtain the complex oxide powder including Zn and W as a calcinated product or in order to obtain the $ZnWO_4$ type crystal phase, the calcination temperature of the primary mixture is preferably not less than 550° C. The calcination temperature of the primary mixture is more preferably not less than 550° C. and less than 1000° C., and is further preferably not less than 550° C. and not more than 900° C. The calcination temperature is preferably lower as long as the crystal phase is formed at the calcination temperature, since the particle size of the calcinated powder can be made as small as possible. In this way, the calcinated powder including the $ZnWO_4$ type crystal phase can be obtained. The calcination atmosphere may be any atmosphere as long as the atmosphere includes oxygen. However, it is preferable to employ: an air atmosphere having an atmospheric pressure or having a pressure higher than that of the atmospheric air; or an oxygen-nitrogen mixture atmosphere having an atmospheric pressure or including not less than 25 volumes % of oxygen having a pressure higher than that of the atmospheric air. For high productivity, the air atmosphere having an atmospheric pressure or a pressure thereabout is more preferable.

(3-2) Step of Forming Calcinated Powder of Indium Tungstate Oxide

The obtained primary mixture is heated (calcinated) to form the calcinated powder (complex oxide powder including In and W). The calcination temperature of the primary mixture is preferably less than 1400° C. to prevent the particle size of the calcinated product from being too large and prevent decrease of the apparent density or mechanical strength of the sintered material. In order to obtain the complex oxide powder including In and W as the calcinated product or obtain the $In_6WO_{12}$ type crystal phase, the calcination temperature of the primary mixture is preferably not less than 700° C. More preferably, the calcination temperature of the primary mixture is not less than 800° C. and less than 1300° C. The calcination temperature is preferably lower as long as the crystal phase is formed at the calcination temperature, since the particle size of the calcinated powder can be made as small as possible. In this way, the calcinated powder including the $In_6WO_{12}$ type crystal phase can be obtained. The calcination atmosphere may be any atmosphere as long as the atmosphere includes oxygen. However, it is preferable to employ: an air atmosphere having an atmospheric pressure or having a pressure higher than that of the atmospheric air; or an oxygen-nitrogen mixture atmosphere having an atmospheric pressure or including not less than 25 volumes % of oxygen having a pressure higher than that of the atmospheric air. For high productivity, the air atmosphere having an atmospheric pressure or a pressure thereabout is more preferable.

(4) Step of Preparing Secondary Mixture of Source Powder Including Calcinated Powder Next, in the same manner as in the preparation of the primary mixture, the obtained calcinated powder is mixed (or pulverized and mixed) with the remainder (the indium oxide powder (for example, $In_2O_3$ powder) or the zinc oxide powder (for example, ZnO powder)) of the source powders. In this way, the secondary mixture of the source powder is obtained. The tungsten oxide preferably exists as a complex oxide as a result of the calcination step.

(5) Step of Forming Molded Body by Molding Secondary Mixture

Next, the obtained secondary mixture is molded. Although a method of molding the secondary mixture should not be particularly limited, it is preferable to employ an uniaxial pressing method, a CIP (Cold Isostatic Pressing) method, a casting method, or the like in order to increase the apparent density of the oxide sintered material.

(6) Step of Forming Oxide Sintered Material by Sintering Molded Body

Next, the obtained molded body is sintered to form the oxide sintered material. In doing so, for productivity, it is preferable not to employ a hot-press sintering method. Although the sintering temperature of the molded body should not be particularly limited, the sintering temperature of the molded body is preferably not less than 900° C. and less than 1200° C. in order to increase the apparent density of the oxide sintered material to be formed to exceed 6.4 $g/cm^3$ and increase the mechanical strength thereof. Although the sintering atmosphere also should not be particularly limited, the sintering atmosphere is preferably an air atmosphere having an atmospheric pressure or a pressure thereabout in order to prevent the particle size of the crystal of the oxide sintered material from being large and prevent occurrence of cracks.

Third Embodiment: Sputtering Target

The sputtering target according to the present embodiment includes the oxide sintered material of the first embodiment. Hence, the sputtering target according to the present embodiment can be used suitably to form, by the sputtering method, an oxide semiconductor film of the semiconductor device having high field effect mobility and high reliability.

The sputtering target according to the present embodiment preferably includes the oxide sintered material of the first embodiment and is more preferably composed of the oxide sintered material of the first embodiment such that the sputtering target can be used suitably to form an oxide semiconductor film of a semiconductor device having high field effect mobility and high reliability by the sputtering method.

Fourth Embodiment: Semiconductor Device and Method of Producing Semiconductor Device With reference to FIG. 1A and FIG. 1B, a semiconductor device 10 according to the present embodiment includes an oxide semiconductor film 14 formed using the oxide sintered material of the first embodiment or formed by the sputtering method using the sputtering target of the third embodiment. Since the semiconductor device according to the present embodiment includes such an oxide semiconductor film 14, the semiconductor device according to the present embodiment can have characteristics such as high field effect mobility and high reliability.

Although semiconductor device 10 according to the present embodiment should not be particularly limited, semiconductor device 10 according to the present embodiment is preferably a TFT (thin film transistor) because it has high field effect mobility and high reliability, for example. Since oxide semiconductor film 14 included in the TFT has high field effect mobility and high reliability, oxide semiconductor film 14 preferably serves as a channel layer.

In semiconductor device 10 according to the present embodiment, the W content of oxide semiconductor film 14 is preferably more than 0.5 atom % and not more than 5.0 atom %, the Zn content of oxide semiconductor film 14 is preferably not less than 1 atom % and less than 50 atom %, and the Zn/W ratio of oxide semiconductor film 14 is preferably more than 1.0 and less than 100. Accordingly, the field effect mobility and reliability of semiconductor device 10 can be improved.

In order to improve the field effect mobility and reliability, the W content of oxide semiconductor film 14 is more preferably not less than 0.6 atom % and not more than 3 atom %, and is further preferably not more than 2 atom %. When the W content of oxide semiconductor film 14 is not more than 0.5 atom %, the reliability is decreased in the semiconductor device including such an oxide semiconductor film 14 as a channel layer. When the W content of oxide semiconductor film 14 is more than 5 atom %, the field effect mobility becomes low in the semiconductor device including such an oxide semiconductor film as a channel layer.

When the Zn content of oxide semiconductor film 14 is not less than 1 atom % and less than 50 atom % and the Zn/W ratio of oxide semiconductor film 14 is more than 1.0 and less than 100, the field effect mobility and reliability can be increased in the semiconductor device including such an oxide semiconductor film 14 as a channel layer.

In order to improve the field effect mobility and reliability, the Zn content of oxide semiconductor film 14 is more preferably more than 3 atom % and not more than 40 atom %, and is further preferably not less than 5 atom % and less than 20 atom %.

When the Zn content of oxide semiconductor film 14 is less than 1 atom %, the reliability becomes low in the semiconductor device including such an oxide semiconductor film 14 as a channel layer. When the Zn content of oxide semiconductor film 14 is not less than 50 atom %, the field effect mobility is decreased in the semiconductor device including such an oxide semiconductor film 14 as a channel layer.

When the Zn/W ratio in oxide semiconductor film 14 is not more than 1.0, the reliability becomes low in the semiconductor device including such an oxide semiconductor film 14 as a channel layer. The Zn/W ratio is more preferably not less than 3.0, and is further preferably not less than 5.0. When the Zn/W ratio is not less than 100 in oxide semiconductor film 14, the field effect mobility is decreased in the semiconductor device including such an oxide semiconductor film 14 as a channel layer. The Zn/W ratio is more preferably less than 20.

The chemical composition of oxide semiconductor film 14, i.e., the respective contents of the elements, are measured by RBS (Rutherford Backscattering Spectrometry). Based on the result of measurement, the W content, the Zn content, and the Zn/W ratio are calculated. If the analysis with RBS cannot be performed, they are measured through TEM-EDX (Transmission Electron Microscope with Energy Dispersive X-Ray Fluorescent Emission Spectrometer). The measurement with RBS is desirable in view of precision in measuring the chemical composition. If the TEM-EDX is used, as samples for drawing a calibration curve, at least three or more oxide semiconductor films are first prepared each of which is composed of In, W, Zn, and O, has a composition close to that of the oxide semiconductor film to be measured, and can be analyzed by RBS. Next, the respective contents of In, W, and Zn in each of these samples are measured by RBS and the respective contents of In, W, and Zn in each of these samples are measured by TEM-EDX. Based on these measured values, a calibration curve is drawn to indicate a relation between the measured values of the contents of In, W, and Zn by TEM-EDX and the measured values of the contents of In, W, and Zn by RBS. Then, the respective contents of In, W, and Zn in the oxide semiconductor film to be measured are measured by TEM-EDX, and the resulting measured values are converted into measured values of the respective contents of In, W, and Zn by RBS based on the calibration curve. The converted values represent the respective contents of In, W and Zn in the measured oxide semiconductor film.

Oxide semiconductor 14 may further contain zirconium (Zr). The content of zirconium (Zr) is not less than $1 \times 10^{17}$ atms/cm$^3$ and not more than $1 \times 10^{20}$ atms/cm$^3$, for example. Zr is an element that can be introduced in the production process for the oxide sintered material, and can be introduced into oxide semiconductor film 14 formed using this oxide sintered material as a source material; however, existence of Zr does not hinder high field effect mobility and high reliability. The existence and content of zirconium can be confirmed by a secondary ion mass spectrometer.

Here, the following describes the reliability of the semiconductor device. Generally, in the case of an oxide semiconductor, reliability of a semiconductor device is changed by changing sputtering power during production of the semiconductor device. By increasing the sputtering power, the reliability of the semiconductor device is improved. Although it is unknown why the reliability is improved, it is considered that the film density of the oxide semiconductor film obtained is improved to decrease a carrier trap level density, which affects the reliability of the semiconductor device.

Oxide semiconductor film 14 is preferably composed of at least one of a nano crystal oxide and an amorphous oxide because high field effect mobility and high reliability can be achieved in a semiconductor device (for example, TFT) including such an oxide semiconductor film 14 as a channel layer.

In the present specification, the term "nano crystal oxide" refers to an oxide for which no peak resulting from crystal is observed and only a broad peak called "halo" appearing at the low angle side is observed in an X-ray diffraction measurement under below-described conditions, and for which a ring-like pattern is observed when performing transmission electron beam diffraction measurement in a minute region under below-described conditions using a transmission electron microscope. The term "ring-like pattern" encompasses a case where spots are gathered to form a ring-like pattern.

Moreover, in the present specification, the term "amorphous oxide" refers to an oxide for which no peak resulting from crystal is observed and only a broad peak called "halo" appearing at the low angle side is observed in the X-ray diffraction measurement under below-described conditions, and for which the unclear pattern called "halo" is also observed even when performing transmission electron beam diffraction measurement in a minute region under the below-described conditions using a transmission electron microscope.

(X-Ray Diffraction Measurement Conditions)

Measurement method: In-plane method (slit collimation method);

X-ray generator: anticathode Cu, output 50 kV 300 mA;

Detector: scintillation counter;

Incidence portion: slit collimation;

Soller slit: incidence side vertical divergence angle of 0.48°, light receiving side vertical divergence angle of 0.41°;

Slit: incidence side S1=1 mm*10 mm, light receiving side S2=0.2 mm*10 mm;

Scanning condition: Scanning axis 2θχ/φ;

Scanning mode: Step measurement, scanning range of 10° to 80°, step width of 0.1°;

Step time: 8 sec.

(Transmission Electron Beam Diffraction Measurement Conditions)

Measurement method: microscopic electron beam diffraction method,

Acceleration voltage: 200 kV,

Beam diameter: the same as or equivalent to the film thickness of the oxide semiconductor film to be measured If oxide semiconductor film 14 is composed of the nano crystal oxide, the ring-like pattern is observed as described above and no spot-like pattern is observed when performing transmission electron beam diffraction measurement in the minute region under the above conditions. On the other hand, an oxide semiconductor film disclosed in, for example, Japanese Patent No. 5172918 includes crystal oriented toward the c axis in a direction perpendicular to the surface of the film. When the nano crystal in the minute region is thus oriented in a certain direction, a spot-like pattern is observed. When oxide semiconductor film 14 is composed of the nano crystal oxide, the nano crystal is of non-orientation or has a random orientation, i.e., is not oriented toward the surface of the film when at least observing a plane (film cross section) perpendicular to the plane of the film. That is, the crystal axis thereof is not oriented in the film thickness direction.

Since oxide semiconductor film 14 is composed of the nano crystal oxide or the amorphous oxide, a semiconductor device including such an oxide semiconductor film 14 as a channel layer can achieve high field effect mobility. In order to improve field effect mobility, oxide semiconductor film 14 is more preferably composed of the amorphous oxide. The film thickness of oxide semiconductor film 14 is not less than 2 nm and not more than 60 nm, for example.

In the semiconductor device of the present embodiment, oxide semiconductor film 14 preferably has an electrical resistivity of not less than $10^{-1}$ Ωcm. A multiplicity of transparent conductive films employing indium oxide have been examined thus far, and an electrical resistivity of less than $10^{-1}$ Ωcm is required for applications of such transparent conductive films. On the other hand, the oxide semiconductor film included in the semiconductor device of the present embodiment preferably has an electrical resistivity of not less than $10^{-1}$ Ωcm, whereby the oxide semiconductor film can be used suitably as a channel layer of the semiconductor device. When the electrical resistivity is less than $10^{-1}$ Ωcm, it is difficult to use it as a channel layer of a semiconductor device.

Oxide semiconductor film 14 can be obtained by a production method including a step of forming a film through the sputtering method. The meaning of the sputtering method is defined as described above. As a method of forming the oxide semiconductor film, not only the sputtering method but also a pulse laser vapor deposition (PLD) method, a heating deposition method, and the like have been proposed; however, in view of productivity, the sputtering method is preferably used.

As the sputtering method, a magnetron sputtering method, a facing target magnetron sputtering method, or the like can be used. As an atmospheric gas during the sputtering, Ar gas, Kr gas, and Xe gas can be used, and may be mixed with and used together with oxygen gas.

Moreover, oxide semiconductor film 14 can be obtained by heating after forming the film by the sputtering method or can be obtained by heating while forming the film by the sputtering method. Accordingly, an oxide semiconductor film composed of the nano crystal oxide or the amorphous oxide can be readily obtained. Moreover, the oxide semiconductor film obtained by this method is advantageous in improving field effect mobility and reliability in a semiconductor device (for example, TFT) including this oxide semiconductor film as a channel layer.

The heating performed while forming the film by the sputtering method can be performed by heating the substrate during the formation of the film. Preferably, the substrate temperature is not less than 100° C. and not more than 250° C. The heating time corresponds to the film formation time, and the film formation time can be, for example, about 10 seconds to 10 minutes although the film formation time depends on the film thickness of oxide semiconductor film 14 to be formed.

Likewise, the heating performed after forming the film by the sputtering method can be performed by heating the substrate. In order to obtain high reliability, it is preferable to perform heating after forming the film by the sputtering method. In this case, the heating may be performed immediately after forming oxide semiconductor film 14, or may be performed after forming a source electrode, a drain electrode, an etch stopper layer (ES layer), a passivation layer, or the like. In order to obtain high reliability, it is more preferable to perform heating after forming the etch stopper layer.

When performing heating after forming oxide semiconductor film 14, the substrate temperature is preferably not less than 100° C. and not more than 500° C. The heating may be performed in a various types of atmospheres such as atmospheric air, nitrogen gas, nitrogen gas-oxygen gas, Ar gas, Ar-oxygen gas, water-vapor-containing atmospheric air, and water-vapor-containing nitrogen. A pressure of the atmosphere can be an atmospheric pressure, a reduced pressure (for example, less than 0.1 Pa), or an increased pressure (for example, 0.1 Pa to 9 MPa), but is preferably the atmospheric pressure. The heating time can be, for example, about 3 minutes to 2 hours, and is preferably about 10 minutes to 90 minutes.

FIG. 1A, FIG. 1B, FIG. 2, and FIG. 3 are schematic views showing some exemplary semiconductor devices (TFT) according to the present embodiment. A semiconductor device 10 shown in FIG. 1A and FIG. 1B includes: a substrate 11; a gate electrode 12 disposed on substrate 11; a gate insulating film 13 disposed as an insulating layer on gate electrode 12; oxide semiconductor film 14 disposed as a channel layer on gate insulating film 13; and a source electrode 15 and a drain electrode 16 disposed on oxide semiconductor film 14 not in contact with each other.

Figure 1B:
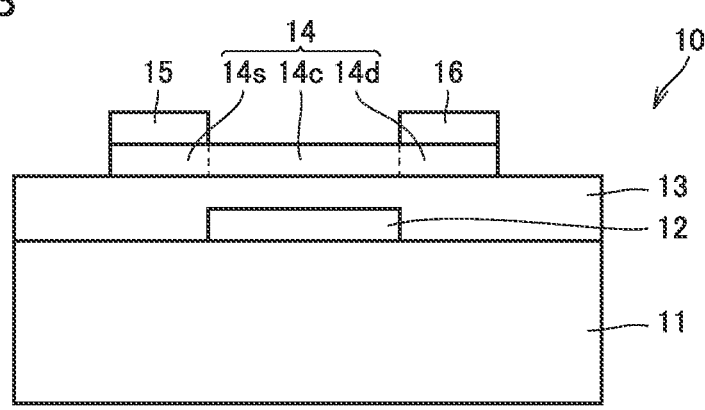
FIG. 1B is a schematic cross sectional view along an IB-IB line shown in FIG. 1A.
Figure 2:
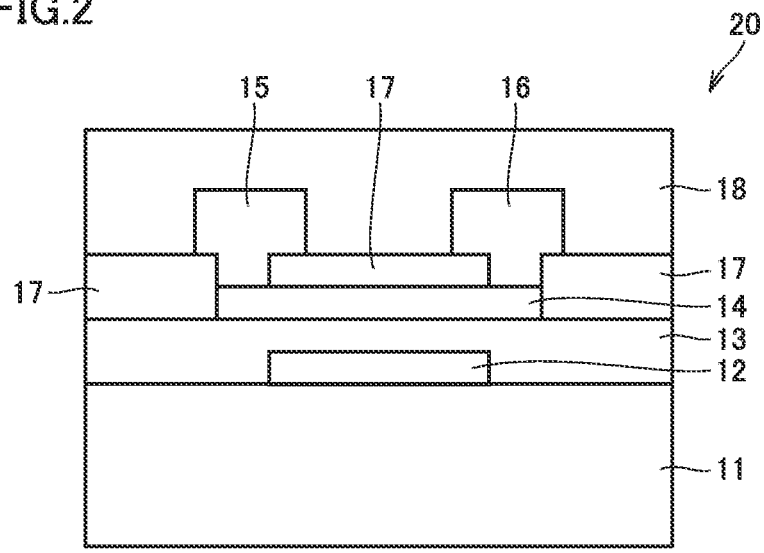
FIG. 2 is a schematic cross sectional view showing another exemplary semiconductor device according to one embodiment of the present invention.

A semiconductor device 20 shown in FIG. 2 has the same configuration as that of semiconductor device 10 shown in FIG. 1A and FIG. 1B except that semiconductor device 20 further includes: an etch stopper layer 17 disposed on gate insulating film 13 and oxide semiconductor film 14 and provided with a contact hole; and a passivation film 18 disposed on etch stopper layer 17, source electrode 15, and drain electrode 16. In semiconductor device 20 shown in FIG. 2, passivation film 18 can be omitted as in semiconductor device 10 shown in FIG. 1A and FIG. 1B. A semiconductor device 30 shown in FIG. 3 has the same configuration as semiconductor device 10 shown in FIG. 1A and FIG. 1B except that semiconductor device 30 further includes a passivation film 18 disposed on gate insulating film 13, source electrode 15, and drain electrode 16.

Each of the semiconductor devices according to the present embodiment includes oxide semiconductor film 14 described above, and preferably further includes a layer (hereinafter, also referred to as "amorphous adjacent layer"), which is disposed in contact with at least a portion of oxide semiconductor film 14 and which is an amorphous layer.

According to the semiconductor device including the amorphous adjacent layer, high field effect mobility can be held and high reliability can be realized when oxide semiconductor film 14 is maintained to be composed of the amorphous oxide even if the temperature in the above-described heating is high. Examples of the amorphous adjacent layer include gate insulating film 13, passivation layer 18, and etch stopper layer 17.

The amorphous adjacent layer may be a layer formed in contact with oxide semiconductor film 14 as a layer (lower layer) lying below oxide semiconductor film 14, or may be an upper layer formed on/above and in contact with oxide semiconductor film 14. Moreover, the semiconductor device according to the present embodiment can include two or more adjacent layers. In this case, these adjacent layers can be layers disposed below and above oxide semiconductor film 14.

For example, in semiconductor device 10 shown in FIG. 1A and FIG. 1B, gate insulating film 13 may be the amorphous adjacent layer. In semiconductor device 20 shown in FIG. 2, gate insulating film 13 and/or etch stopper layer 17 may be the amorphous adjacent layer(s). In semiconductor device 30 shown in FIG. 3, gate insulating film 13 and/or passivation film 18 may be the amorphous adjacent layer(s).

The amorphous adjacent layer is preferably an oxide layer including at least one of silicon and aluminum. In order to improve the field effect mobility and reliability of the semiconductor device, it is advantageous that the amorphous adjacent layer is an oxide layer including at least one of silicon and aluminum. Particularly, it is advantageous in providing a semiconductor device that can maintain high field effect mobility even if the temperature in the above-described heating is high. Moreover, when the amorphous adjacent layer is an oxide layer including at least one of silicon and aluminum, it can be advantageous in reducing off current. Examples of the oxide including at least one of silicon and aluminum can include, but not particularly limited to, silicon oxide ($SiO_x$), aluminum oxide ($Al_mO_n$), and the like.

Next, the following describes methods of producing the semiconductor devices according to the present embodiment. Each of the methods of producing the semiconductor devices includes the steps of: preparing the sputtering target of the foregoing embodiment; and forming the oxide semiconductor film by the sputtering method using this sputtering target. First, a method of producing semiconductor device 10 shown in FIG. 1A and FIG. 1B will be described. Although this production method should not be particularly limited, in order to efficiently produce semiconductor device 10 having high characteristics, with reference to FIG. 4A to FIG. 4D, the production method preferably includes the steps of: forming gate electrode 12 on substrate 11 (FIG. 4A); forming gate insulating film 13 as an insulating layer on gate electrode 12 and substrate 11 (FIG. 4B); forming oxide semiconductor film 14 as a channel layer on gate insulating film 13 (FIG. 4C); and forming source electrode 15 and drain electrode 16 on oxide semiconductor film 14 not to be in contact with each other (FIG. 4D).

(1) Step of Forming Gate Electrode

Figure 4A:
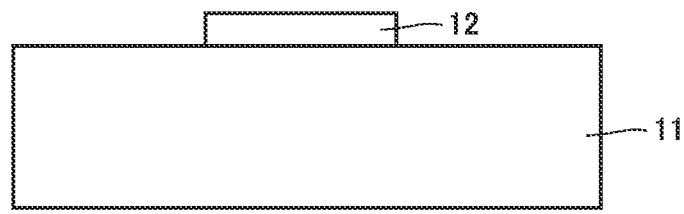
FIG. 4A is a schematic cross sectional view showing an exemplary method of producing the semiconductor device shown in FIG. 1A and FIG. 1B.

With reference to FIG. 4A, gate electrode 12 is formed on substrate 11. Although substrate 11 should not be particularly limited, substrate 11 is preferably a quartz glass substrate, a non-alkali glass substrate, an alkaline glass substrate, or the like in order to increase transparency, price stability, and surface smoothness. Although gate electrode 12 should not be particularly limited, gate electrode 12 is preferably a Mo electrode, a Ti electrode, a W electrode, an Al electrode, a Cu electrode, or the like because these electrodes have high oxidation resistances and low electric resistances. Although the method of forming gate electrode 12 should not be particularly limited, the method of forming gate electrode 12 is preferably a vacuum deposition method, the sputtering method, or the like because a large area of gate electrode 12 can be uniformly formed on the main surface of substrate 11 by these methods. When gate electrode 12 is partially formed on the surface of substrate 11 as shown in FIG. 4A, an etching method employing a photoresist can be used.

(2) Step of Forming Gate Insulating Film

Figure 4B:
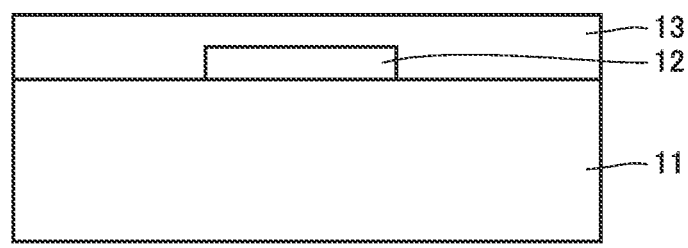
FIG. 4B is a schematic cross sectional view showing an exemplary method of producing the semiconductor device shown in FIG. 1A and FIG. 1B.

With reference to FIG. 4B, gate insulating film 13 is formed as an insulating layer on gate electrode 12 and substrate 11. Although a method of forming gate insulating film 13 should not be particularly limited, the method of forming gate insulating film 13 is preferably a plasma CVD (chemical vapor deposition) method or the like because a large area of gate insulating film 13 can be uniformly formed and an insulating property can be secured by the plasma CVD method.

Although the material of gate insulating film 13 should not be particularly limited, the material of gate insulating film 13 is preferably silicon oxide ($SiO_x$), silicon nitride ($SiN_y$), or the like in view of the insulating property. Moreover, when gate insulating film 13 is configured as the above-described amorphous adjacent layer, gate insulating film 13 is preferably an oxide including at least one of silicon and aluminum, such as silicon oxide ($SiO_x$) or aluminum oxide ($Al_mO_n$).

(3) Step of Forming Oxide Semiconductor Film

Figure 4C:
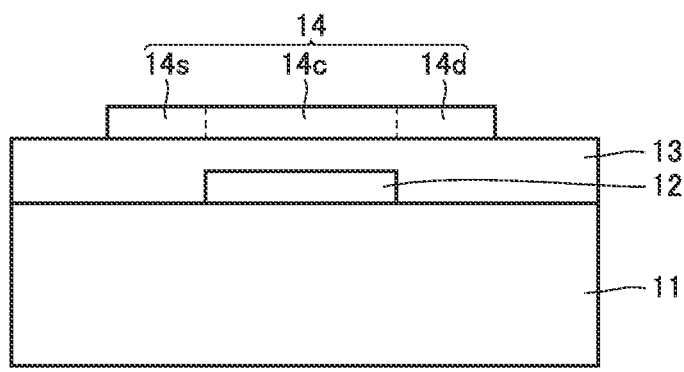
FIG. 4C is a schematic cross sectional view showing an exemplary method of producing the semiconductor device shown in FIG. 1A and FIG. 1B.
Figure 4D:
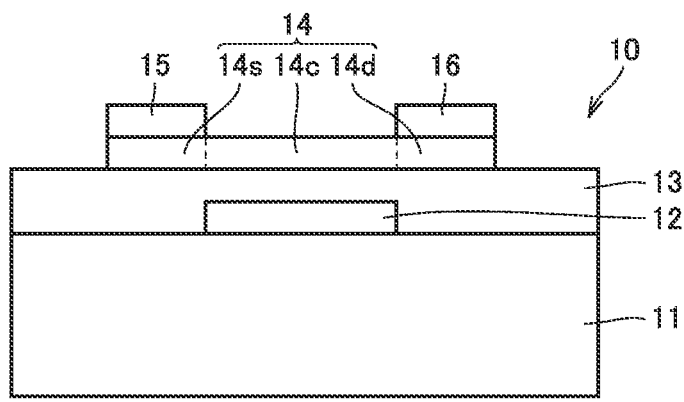
FIG. 4D is a schematic cross sectional view showing an exemplary method of producing the semiconductor device shown in FIG. 1A and FIG. 1B.

With reference to FIG. 4C, oxide semiconductor film 14 is formed as a channel layer on gate insulating film 13. As described above, oxide semiconductor film 14 is preferably formed by the step of forming oxide semiconductor film 14 by the sputtering method, and is preferably heated after forming the film by the sputtering method or is preferably heated while forming the film by the sputtering method, for example. As the source target (sputtering target) for the sputtering method, the oxide sintered material of the first embodiment above is used.

In order to obtain high reliability, heating is preferably performed after forming the film by the sputtering method. In this case, heating may be performed immediately after forming oxide semiconductor film 14, or may be performed after forming source electrode 15, drain electrode 16, etch stopper layer 17, passivation layer 18, or the like. In order to obtain high reliability, it is more preferable to perform the heating after forming etch stopper layer 17. If the heating is performed after forming etch stopper layer 17, this heating may be performed before or after forming source electrode 15 and drain electrode 16, but is preferably performed before forming passivation layer 18.

(4) Step of Forming Source Electrode and Drain Electrode

With reference to FIG. 4D, source electrode 15 and drain electrode 16 are formed on oxide semiconductor film 14 not to be in contact with each other. Although source electrode 15 and drain electrode 16 should not be particularly limited, each of source electrode 15 and drain electrode 16 is preferably a Mo electrode, a Ti electrode, a W electrode, an Al electrode, a Cu electrode, or the like because these electrodes have high oxidation resistances, low electric resistances, and low contact electric resistances with respect to oxide semiconductor film 14. Although a method of forming source electrode 15 and drain electrode 16 should not be particularly limited, the method of forming source electrode 15 and drain electrode 16 is preferably the vacuum deposition method, the sputtering method, or the like because large areas of source electrode 15 and drain electrode 16 can be uniformly formed on the main surface of substrate 11 having oxide semiconductor film 14 formed thereon. Although a method of forming source electrode 15 and drain electrode 16 not to be in contact with each other should not be particularly limited, the method of forming source electrode 15 and drain electrode 16 not to be in contact with each other is preferably formation using an etching method employing a photoresist because large areas of uniform patterns of source electrode 15 and drain electrode 16 can be formed by the etching method.

Figure 5A:
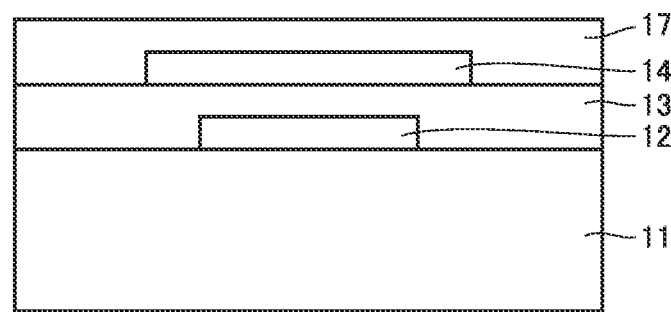
FIG. 5A is a schematic cross sectional view showing an exemplary method of producing the semiconductor device shown in FIG. 2.

Next, a method of producing semiconductor device 20 shown in FIG. 2 will be described. This production method can be the same as the method of producing semiconductor device 10 shown in FIG. 1A and FIG. 1B except that this production method further includes the steps of: forming etch stopper layer 17 provided with contact hole 17a; and forming passivation film 18. Specifically, with reference to FIG. 4A to FIG. 4D and FIG. 5A to FIG. 5D, the method of producing semiconductor device 20 includes the steps of: forming gate electrode 12 on substrate 11 (FIG. 4A); forming gate insulating film 13 as an insulating layer on gate electrode 12 and substrate 11 (FIG. 4B); forming oxide semiconductor film 14 as a channel layer on gate insulating film 13 (FIG. 4C); forming etch stopper layer 17 on oxide semiconductor film 14 and gate insulating film 13 (FIG. 5A); forming contact hole 17a in etch stopper layer 17 (FIG. 5B); forming source electrode 15 and drain electrode 16 on oxide semiconductor film 14 and etch stopper layer 17 not to be in contact with each other (FIG. 5C); and forming passivation film 18 on etch stopper layer 17, source electrode 15, and drain electrode 16 (FIG. 5D).

Although the material of etch stopper layer 17 should not be particularly limited, the material of etch stopper layer 17 is preferably silicon oxide ($SiO_x$), silicon nitride ($SiN_y$), aluminum oxide ($Al_mO_n$), or the like in view of the insulating property. Moreover, when etch stopper layer 17 is configured as the above-described amorphous adjacent layer, etch stopper layer 17 is preferably an oxide including at least one of silicon and aluminum, such as silicon oxide ($SiO_x$) or aluminum oxide ($Al_mO_n$). Etch stopper layer 17 may be a combination of films composed of different materials. Although a method of forming etch stopper layer 17 should not be particularly limited, the method of forming etch stopper layer 17 is preferably the plasma CVD (chemical vapor deposition) method, the sputtering method, the vacuum deposition method, or the like because a large area of etch stopper layer 17 can be uniformly formed and an insulating property can be secured by these methods.

Figure 5B:
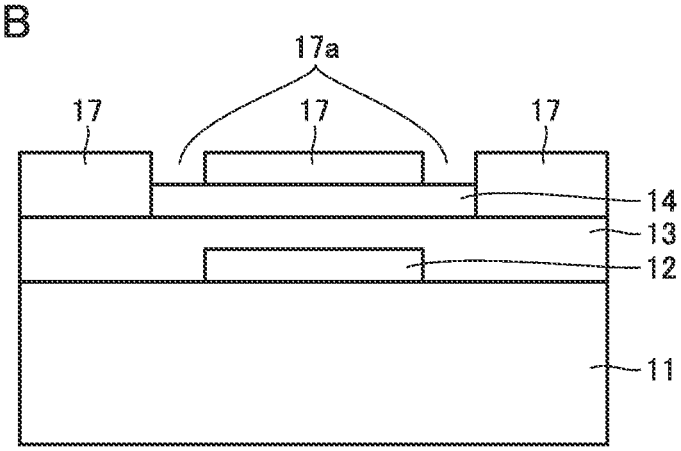
FIG. 5B is a schematic cross sectional view showing an exemplary method of producing the semiconductor device shown in FIG. 2.
Figure 5C:
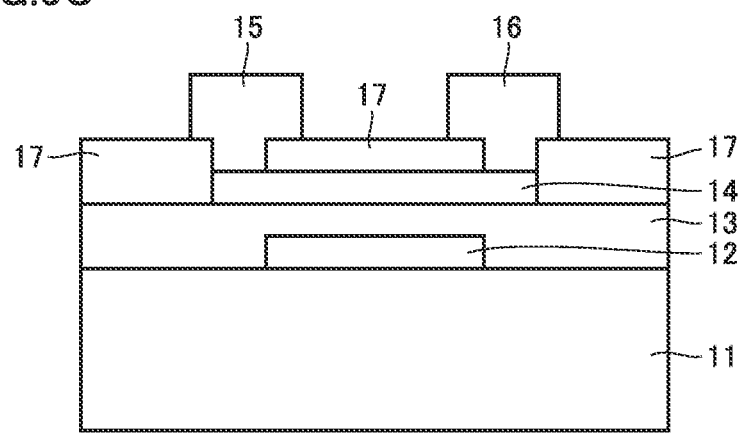
FIG. 5C is a schematic cross sectional view showing an exemplary method of producing the semiconductor device shown in FIG. 2.

Since source electrode 15 and drain electrode 16 need to be in contact with oxide semiconductor film 14, contact hole 17a is formed in etch stopper layer 17 after forming etch stopper layer 17 on oxide semiconductor film 14 (FIG. 5B). Examples of a method of forming contact hole 17a can include dry etching or wet etching. By etching etch stopper layer 17 by such a method to form contact hole 17a, the surface of oxide semiconductor film 14 is exposed at the etched portion.

Figure 5D:
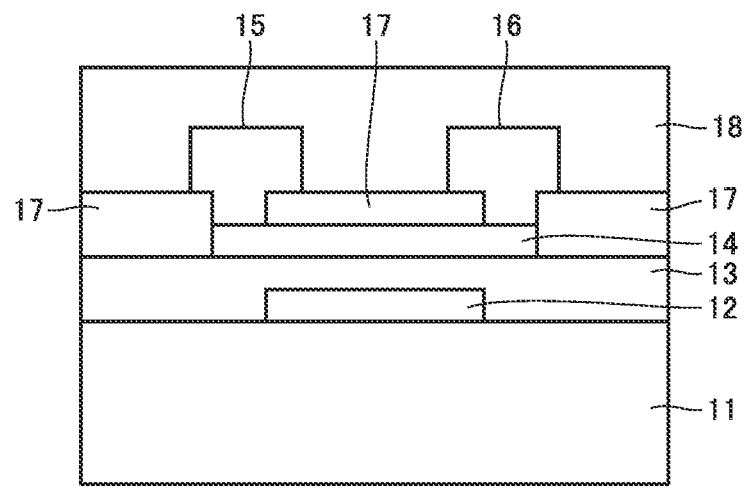
FIG. 5D is a schematic cross sectional view showing an exemplary method of producing the semiconductor device shown in FIG. 2.

In the method of producing semiconductor device 20 shown in FIG. 2, as with the method of producing semiconductor device 10 shown in FIG. 1A and FIG. 1B, source electrode 15 and drain electrode 16 are formed on oxide semiconductor film 14 and etch stopper layer 17 not to be in contact with each other (FIG. 5C), and then passivation film 18 is formed on etch stopper layer 17, source electrode 15, and drain electrode 16 (FIG. 5D).

Although the material of passivation film 18 should not be particularly limited, the material of passivation film 18 is preferably silicon oxide ($SiO_x$), silicon nitride ($SiN_y$), aluminum oxide ($Al_mO_n$) or the like in view of the insulating property. Moreover, when passivation film 18 is configured as the above-described amorphous adjacent layer, passivation film 18 is preferably an oxide including at least one of silicon and aluminum such as silicon oxide ($SiO_x$) or aluminum oxide ($Al_mO_n$). Passivation film 18 may be a combination of films composed of different materials. Although a method of forming passivation film 18 should not be particularly limited, the method of forming passivation film 18 is preferably the plasma CVD (chemical vapor deposition) method, the sputtering method, the vacuum deposition method, or the like because a large area of passivation film 18 can be uniformly formed and an insulating property is secured by these methods.

Figure 3:
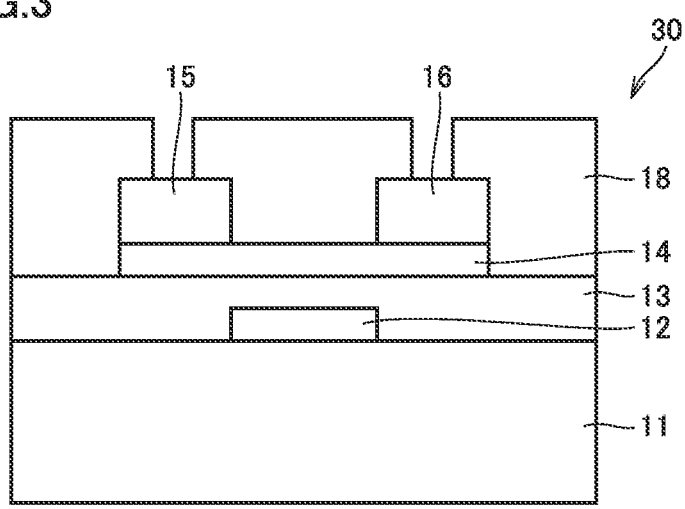
FIG. 3 is a schematic cross sectional view showing still another exemplary semiconductor device according to one embodiment of the present invention.

Moreover, as in semiconductor device 30 shown in FIG. 3, a back channel etch (BCE) structure may be employed without forming etch stopper layer 17 and passivation film 18 may be formed directly on gate insulating film 13, oxide semiconductor film 14, source electrode 15, and drain electrode 16. For passivation film 18 in this case, reference is made to the above description regarding passivation film 18 included in semiconductor device 20 shown in FIG. 2.

(5) Other Step

Finally, heating is normally performed. The heating can be performed by heating the substrate. The substrate temperature is preferably not less than 100° C. and not more than 250° C. The heating may be performed in a various types of atmospheres such as atmospheric air, nitrogen gas, nitrogen gas-oxygen gas, Ar gas, Ar-oxygen gas, water-vapor-containing atmospheric air, and water-vapor-containing nitrogen. Preferably, the atmosphere of the heating is a nitrogen or inert atmosphere such as Ar gas. A pressure of the atmosphere can be an atmospheric pressure, a reduced pressure (for example, less than 0.1 Pa), or an increased pressure (for example, 0.1 Pa to 9 MPa), but is preferably the atmospheric pressure. The heating time can be, for example, about 3 minutes to 2 hours, and is preferably about 10 minutes to 90 minutes.

EXAMPLES

Examples 1 to 20

(1) Production of Oxide Sintered Material
(1-1) Preparation of Source Powders

The following powders were prepared: a tungsten oxide powder (denoted as "W" in Table 1) having composition and median particle size d50 (denoted as "W Particle Size" in Table 1) shown in Table 1 and having a purity of 99.99 mass %; a ZnO powder (denoted as "Z" in Table 1) having a median particle size d50 of 1.0 μm and having a purity of 99.99 mass %; and an $In_2O_3$ powder (denoted as "I" in Table 1) having a median particle size d50 of 1.0 μm and having a purity of 99.99 mass %.

(1-2) Preparation of Primary Mixture of Source Powders

From the source powders thus prepared, the tungsten oxide powder and the ZnO powder or the tungsten oxide powder and the indium oxide powder were first introduced into a ball mill and were pulverized and mixed for 18 hours, thereby preparing a primary mixture of the source powders. The tungsten oxide powder and the ZnO powder were mixed at about the following molar mixing ratio: tungsten oxide powder:ZnO powder=1:1. The tungsten oxide powder and the indium oxide powder were mixed at about the following molar mixture ratio: tungsten oxide powder:$In_2O_3$ powder=1:3. During the pulverization and mixing, ethanol was used as a dispersion medium. The obtained primary mixture of the source powders was dried in the atmospheric air.

(1-3) Formation of Calcinated Powder by Heating Primary Mixture

Next, the obtained primary mixture of the source powders was introduced into a crucible composed of alumina, and was calcinated in an air atmosphere for 8 hours at a calcination temperature shown in Table 1, thereby obtaining a calcinated powder composed of the $ZnWO_4$ type crystal phase or a calcinated powder composed of the $In_6WO_{12}$ type crystal phase. The composition (type) of the crystal phase in the obtained calcinated powder is shown in Table 1.

(1-4) Preparation of Secondary Mixture of Source Powders Including Calcinated Powder Next, the obtained calcinated powder was introduced into a pot together with the remainder of the prepared source powders, i.e., the $In_2O_3$ powder or the ZnO powder, which were then introduced into a pulverization-mixing ball mill and were pulverized and mixed for 12 hours. In this way, a secondary mixture of the source powders was prepared. A mixture ratio of these powder was set to achieve a molar ratio of W, Zn, and In in the mixture as shown in Table 1. During the pulverization and mixing, ethanol was used as a dispersion medium. The obtained powder mixture was dried by spray dry.

(1-5) Formation of Molded Body by Molding Secondary Mixture

Next, the obtained secondary mixture was molded using a press, and was molded by CIP in still water of a room temperature (5° C. to 30° C.) under a pressure of 190 MPa, thereby obtaining a disk-like molded body having a diameter of 100 mm and a thickness of about 9 mm.

(1-6) Formation of Oxide Sintered Material by Sintering Molded Body

Next, the obtained molded body was sintered under an atmospheric pressure in an air atmosphere for 8 hours at a sintering temperature shown in Table 1, thereby obtaining an oxide sintered material containing a first crystal phase including a bixbyite type crystal phase ($In_2O_3$ type phase) in which tungsten and zinc are dissolved in a solid state. Tungsten and zinc are determined to be dissolved in a solid state based on confirming that a peak location is displaced from the peak location defined in 6-0416 of the JCPDS card in X-ray diffraction measurement.

(1-7) Evaluation on Physical Properties of Oxide Sintered Material

[A] Measurement of X-Ray Diffraction

A sample was extracted from a portion of the oxide sintered material, and was subjected to crystal analysis by powder X-ray diffractometry, thereby confirming existence/non-existence of the bixbyite type crystal phase, the first diffraction peak at the location of more than 34.74 deg and less than 34.97 deg of 2θ in the X-ray diffraction, and the second diffraction peak at the location of more than 31.77 deg and less than 32.00 deg of 2θ in the X-ray diffraction. Measurement conditions for X-ray diffraction were as follows.

(Measurement Conditions for X-Ray Diffraction)
θ-2θ method,
X-ray source: Cu Kα rays,
X-ray tube voltage: 45 kV,
X-ray tube current: 40 mA,
Step width: 0.03 deg,
Step time: 1 second/step,
Measurement range 2θ: 10 deg to 90 deg.

Each of the oxide sintered materials of the Examples had the bixbyite type crystal phase, the first diffraction peak, and the second diffraction peak. Table 2 shows an angle of the first diffraction peak and an angle of the second diffraction peak. Moreover, based on the result of this X-ray diffraction measurement, Ia and Ib were measured in accordance with the above-described formulas, and Ia/Ib was calculated. The result is shown in Table 2.

[B] Confirmation of First Crystal Phase Being Main Component and Measurement of High-Content Indium Type Crystal Phase Ratio A sample was extracted from a portion of the oxide sintered material and a surface of this sample was polished to be smooth. Next, SEM-EDX (Scanning Secondary Electron Microscope with Energy Dispersive X-Ray Fluorescent Emission Spectrometer) was employed to observe the surface of the sample by SEM (Scanning Secondary Electron Microscope) and analyze a composition ratio of metallic elements in each crystal particle by EDX (Energy Dispersive X-Ray Fluorescent Emission Spectrometer). Then, based on a tendency of the composition ratios of the metallic elements in those crystal particles, the crystal particles were classified into groups. Specifically, the crystal particles were classified into: a group A of crystal particles having a higher Zn content (content (atom %) of Zn relative to a total of In, W, and Zn) than that of a below-described group B; and group B of crystal particles having a very low Zn content or containing no Zn and having a higher In content (content (atom %) of In relative to the total of In, W, and Zn) than that of group A (high-content indium type crystal phase). It was determined that each of the crystal particles of group B was of the first crystal phase.

The "high-content indium type crystal phase ratio" in the oxide sintered material was defined as a ratio (percentage) of an area of the high-content indium type crystal phase (group B) in the surface of the oxide sintered material for which the above-described measurement had been performed. The high-content indium type crystal phase ratio of each of the oxide sintered materials of the Examples was not less than 50%, and the first crystal phase was the main component.

[C] Confirmation of Existence of Second Crystal Phase and Measurement of Average Major Axis Size and Average Aspect Ratio of Crystal Particles Included in Second Crystal Phase In the confirmation of the first crystal phase being the main component and the measurement of the high-content indium type crystal phase ratio in [B] above, the crystal phase classified as group A was determined to be the second crystal phase. Moreover, in the SEM observation during the surface analysis, a reflection electron image of ×500 was measured, the average major axis size and average aspect ratio of the crystal particles included in the second crystal phase observed in deeper gray than group B classified as the first crystal phase were measured in accordance with the above-described method. The result is shown in Table 2.

[D] Confirmation of Existence of Zinc Tungstate Compound Crystal Phase, Indium Tungstate Compound Crystal Phase, Hexagonal Wurtzite Type Crystal Phase, and $In_2O_3(ZnO)_5$ In the measurement of the X-ray diffraction in [A] above, it was confirmed whether or not there are a zinc tungstate compound crystal phase, an indium tungstate compound crystal phase, a hexagonal wurtzite type crystal phase, and $In_2O_3(ZnO)_5$. In each of the Examples and Comparative Examples, existence of the indium tungstate compound crystal phase was not confirmed.

In the column "Crystal Phase" in Table 2, the crystal phases existing in the oxide sintered material were collectively shown. Regarding the crystal phases, abbreviations in Table 2 are intended to indicate below-described crystal phases. It should be noted that the column "Crystal Phase" in Table 2 indicates crystal phases that could be identified by the X-ray diffraction measurement, and is not intended to mean that the oxide sintered materials consist only of the crystal phases described in the column "Crystal Phase".

I: Bixbyite type crystal phase (first crystal phase)
Z: Hexagonal wurtzite type crystal phase (second crystal phase),
ZW: Zinc tungstate compound crystal phase (second crystal phase),
IZ: $In_2O_3(ZnO)_5$ (second crystal phase).

[E] Measurement of Contents of In, Zn, and W in Oxide Sintered Material

The contents of In, Zn, and W in the obtained oxide sintered material were measured by the ICP mass analysis method. Based on these contents, the W content (atom %), Zn content (atom %), and Zn/W ratio (atomic ratio) of the oxide sintered material were calculated. The result is shown in Table 2.

[F] Measurement of Apparent Density of Oxide Sintered Material

The apparent density of the obtained oxide sintered material was determined by an Archimedes method.

[G] Measurement of Tensile Strength of Oxide Sintered Material

A tension test was performed in accordance with a method defined in JIS R 1606:1995. The test was performed at a room temperature (25° C.). Table 2 shows a tensile strength ratio of each of the Examples and the Comparative Examples, assuming that the tensile strength of Comparative Example 1 is 1.

[H] Measurement of Thermal Conductivity of Oxide Sintered Material

In accordance with a method defined in JIS R 1611:2010, thermal diffusivity, specific heat capacity, and thermal conductivity were measured. Table 2 shows a thermal conductivity ratio of each of the Examples and the Comparative Examples, assuming that the thermal conductivity of Comparative Example 1 is 1.

Comparative Examples 1 and 2

Each of oxide sintered materials was produced by the same method as those of the Examples except that the mixture ratio of the tungsten oxide powder, the ZnO powder, and the $In_2O_3$ powder, which were the source powders, was set as shown in Table 1 and except that these source powders were mixed at once without forming the calcinated powder and were sintered at a temperature shown in Table 1. Then, the obtained oxide sintered materials were subjected to evaluation of physical properties. Although each of the oxide sintered materials of the Comparative Examples had the first crystal phase, particles included in the second crystal phase did not have an average major axis size of not less than 3 μm and not more than 50 μm, and did not have an average aspect ratio of not less than 4 and not more than 50. Regarding the oxide sintered material of Comparative Example 2, the particles of the second crystal phase were not dispersed in the high-content indium type crystal phase and were in contact with each other, with the result that the shapes of the particles of the second crystal phase could not be specified. Accordingly, the average major axis size and average aspect ratio thereof could not be measured. In each of the Comparative Examples, the sintering temperature needed to be higher than that in each of the Examples in order to increase the apparent density. The oxide sintered materials were produced in the same manner as in Comparative Examples 1 and 2 except that the sintering temperature was set at 1160° C., and the apparent density of each of these oxide sintered materials was 6.3 g/cm$^3$.

(1-8) Production of Sputtering Target

Each of the obtained oxide sintered materials was processed to have the following size: 3 inches (76.2 mm) in diameter×6 mm in thickness. Then, each of the obtained oxide sintered materials was attached to a copper backing plate using an indium metal.

TABLE 1

|  | Source Powder | | | | | | | |
|---|---|---|---|---|---|---|---|---|
|  | Molar Mixture Ratio | | | W Composition | W Particle Size μm | Calcination Temperature ° C. | Calcinated Complex Oxide Type | Sintering Temperature ° C. |
|  | W (%) | Z (%) | I (%) |  |  |  |  |  |
| Example 1 | 1.18 | 3.50 | 95.32 | $WO_{2.72}$ | 2.2 | 850 | $In_6WO_{12}$ | 1160 |
| Example 2 | 1.81 | 19.78 | 78.41 | $WO_2$ | 2.5 | 850 | $In_6WO_{12}$ | 1160 |
| Example 3 | 1.81 | 19.78 | 78.41 | $WO_2$ | 2.5 | 850 | $In_6WO_{12}$ | 1160 |
| Example 4 | 1.58 | 41.89 | 56.53 | $WO_3$ | 1.2 | 850 | $In_6WO_{12}$ | 1160 |
| Example 5 | 1.58 | 41.89 | 56.53 | $WO_3$ | 1.2 | 850 | $In_6WO_{12}$ | 1160 |
| Example 6 | 1.45 | 53.72 | 44.83 | $WO_2$ | 1.1 | 850 | $In_6WO_{12}$ | 1160 |
| Example 7 | 2.16 | 53.53 | 44.31 | $WO_{2.72}$ | 0.9 | 850 | $In_6WO_{12}$ | 1160 |
| Example 8 | 2.87 | 53.34 | 43.79 | $WO_3$ | 1.1 | 850 | $In_6WO_{12}$ | 1160 |
| Example 9 | 4.26 | 52.97 | 42.77 | $WO_{2.72}$ | 1.1 | 850 | $In_6WO_{12}$ | 1160 |
| Example 10 | 6.71 | 57.41 | 35.88 | $WO_2$ | 0.9 | 850 | $In_6WO_{12}$ | 1160 |
| Example 11 | 1.02 | 31.43 | 67.55 | $WO_3$ | 0.8 | 650 | $ZnWO_4$ | 1150 |
| Example 12 | 1.90 | 10.89 | 87.21 | $WO_{2.72}$ | 2.4 | 650 | $ZnWO_4$ | 1150 |
| Example 13 | 1.68 | 32.32 | 66.00 | $WO_2$ | 1.2 | 650 | $ZnWO_4$ | 1150 |
| Example 14 | 1.68 | 32.32 | 66.00 | $WO_2$ | 1.2 | 650 | $ZnWO_4$ | 1150 |
| Example 15 | 1.58 | 41.89 | 56.53 | $WO_3$ | 1.4 | 650 | $ZnWO_4$ | 1150 |
| Example 16 | 1.58 | 41.89 | 56.53 | $WO_3$ | 1.4 | 650 | $ZnWO_4$ | 1150 |
| Example 17 | 2.25 | 47.87 | 49.88 | $WO_2$ | 0.9 | 650 | $ZnWO_4$ | 1150 |
| Example 18 | 3.30 | 31.06 | 65.64 | $WO_{2.72}$ | 0.8 | 650 | $ZnWO_4$ | 1150 |
| Example 19 | 4.91 | 31.81 | 63.28 | $WO_3$ | 2.6 | 650 | $ZnWO_4$ | 1150 |
| Example 20 | 8.03 | 31.32 | 60.65 | $WO_2$ | 3.0 | 650 | $ZnWO_4$ | 1150 |

TABLE 1-continued

| | Source Powder | | | | | | | |
|---|---|---|---|---|---|---|---|---|
| | Molar Mixture Ratio | | | | W Particle Size μm | Calcination Temperature °C. | Calcinated Complex Oxide Type | Sintering Temperature °C. |
| | W (%) | Z (%) | I (%) | W Composition | | | | |
| Comparative Example 1 | 1.56 | 40.89 | 57.59 | WO$_3$ | 4.0 | — | — | 1200 |
| Comparative Example 2 | 1.56 | 71.55 | 26.93 | WO$_3$ | 4.0 | — | — | 1200 |

TABLE 2

| | Oxide Sintered Material | | | | | | |
|---|---|---|---|---|---|---|---|
| | First Diffraction Peak 2θ deg | Second Diffraction Peak 2θ deg | Ia/Ib | Average Major Axis Size μm | Average Aspect Ratio | Identified Crystal Phase | W Content (atom %) |
| Example 1 | 34.76 | 31.98 | 0.3 | 6 | 7 | I | 0.6 |
| Example 2 | 34.80 | 31.97 | 1.6 | 20 | 23 | I | 1.1 |
| Example 3 | 34.85 | 31.92 | 1.5 | 26 | 30 | I | 1.1 |
| Example 4 | 34.85 | 31.92 | 1.5 | 26 | 30 | I | 1.1 |
| Example 5 | 34.85 | 31.88 | 2.1 | 36 | 39 | I, Z | 1.1 |
| Example 6 | 34.85 | 31.88 | 2.1 | 36 | 39 | I, Z | 1.1 |
| Example 7 | 34.87 | 31.85 | 2.2 | 34 | 36 | I, Z | 1.6 |
| Example 8 | 34.91 | 31.86 | 2.1 | 34 | 32 | I, Z | 2.1 |
| Example 9 | 34.94 | 31.84 | 2.3 | 27 | 29 | I, Z | 3.1 |
| Example 10 | 34.99 | 31.87 | 2.8 | 35 | 39 | I, Z, ZW | 5.0 |
| Example 11 | 34.79 | 31.90 | 0.9 | 26 | 25 | I | 0.6 |
| Example 12 | 34.76 | 31.98 | 0.5 | 6 | 6 | I | 1.0 |
| Example 13 | 34.81 | 31.90 | 1.8 | 27 | 25 | I | 1.0 |
| Example 14 | 34.81 | 31.90 | 1.8 | 27 | 25 | I | 1.0 |
| Example 15 | 34.84 | 31.92 | 1.7 | 23 | 24 | I | 1.0 |
| Example 16 | 34.84 | 31.92 | 1.7 | 23 | 24 | I | 1.0 |
| Example 17 | 34.84 | 31.95 | 2.4 | 28 | 26 | I | 1.5 |
| Example 18 | 34.89 | 31.97 | 1.0 | 16 | 16 | I | 2.0 |
| Example 19 | 34.93 | 31.89 | 1.1 | 15 | 14 | I | 3.0 |
| Example 20 | 34.97 | 31.80 | 0.9 | 13 | 5 | I, Z, ZW | 5.0 |
| Comparative Example 1 | None | None | — | 5 | 2 | I, Z, IZ | 1.0 |
| Comparative Example 2 | None | None | — | Not Measurable | Not Measurable | I, Z, IZ | 1.0 |

| | Oxide Sintered Material | | | | | |
|---|---|---|---|---|---|---|
| | Zn Content (atom %) | Zn/W Ratio (atomic ratio) | Apparent Density (g/cm$^3$) | Tensile Strength | Thermal Conductivity | Target Cracking Power (W) |
| Example 1 | 2.4 | 4.0 | 6.9 | 1.1 | 1.1 | 650 |
| Example 2 | 11 | 10.0 | 6.8 | 1.2 | 1.2 | 700 |
| Example 3 | 26 | 23.6 | 6.7 | 1.3 | 1.2 | 700 |
| Example 4 | 22 | 23.6 | 6.7 | 1.3 | 1.2 | 700 |
| Example 5 | 22 | 32.7 | 6.5 | 1.2 | 1.1 | 650 |
| Example 6 | 36 | 32.7 | 6.5 | 1.2 | 1.1 | 650 |
| Example 7 | 36 | 22.5 | 6.5 | 1.1 | 1.1 | 650 |
| Example 8 | 36 | 17.1 | 6.5 | 1.1 | 1.1 | 650 |
| Example 9 | 36 | 11.6 | 6.6 | 1.1 | 1.1 | 650 |
| Example 10 | 41 | 8.2 | 6.7 | 1.2 | 1.2 | 700 |
| Example 11 | 19 | 31.7 | 6.8 | 1.2 | 1.2 | 700 |
| Example 12 | 6 | 6.0 | 7.0 | 1.1 | 1.1 | 650 |
| Example 13 | 19 | 19.0 | 6.8 | 1.3 | 1.3 | 750 |
| Example 14 | 19 | 19.0 | 6.8 | 1.3 | 1.3 | 750 |
| Example 15 | 26 | 26.0 | 6.7 | 1.2 | 1.3 | 750 |
| Example 16 | 26 | 26.0 | 6.7 | 1.2 | 1.3 | 750 |
| Example 17 | 31 | 20.7 | 6.7 | 1.1 | 1.2 | 700 |
| Example 18 | 19 | 9.5 | 6.9 | 1.1 | 1.1 | 650 |
| Example 19 | 19 | 6.3 | 7.0 | 1.1 | 1.1 | 650 |
| Example 20 | 19 | 3.8 | 7.1 | 1.1 | 1.1 | 650 |

TABLE 2-continued

| | | | | | | |
|---|---|---|---|---|---|---|
| Comparative Example 1 | 25 | 25.0 | 6.7 | 1.0 | 1.0 | 550 |
| Comparative Example 2 | 55 | 55.0 | 6.7 | 0.8 | 0.5 | — |

(2) Production and Evaluation of Semiconductor Device (TFT) Including Oxide Semiconductor Film (2-1) Measurement of Maximum Limit Value (Cracking Power) of Sputtering Power Each of the produced sputtering targets was placed in a film formation chamber of a sputtering apparatus (not shown). The sputtering target was water-cooled via the copper backing plate. With the film formation chamber being set to have a vacuum of about $6\times10^{-5}$ Pa, the target was sputtered as follows.

A mixed gas of Ar (argon) gas and $O_2$ (oxygen) gas was introduced into the film formation chamber until the pressure therein reached 0.5 Pa. An $O_2$ gas content in the mixed gas was 20 volume %. DC power of 300 W was applied to the target to cause and discharge sputtering discharge for 60 minutes. After the 60 minutes, cooling was performed for 10 minutes, the atmosphere of the film formation chamber was then released, and it was checked whether or not the oxide sintered material of the sputtering target was cracked. Under respective applied powers increased by every 50 W from 300 W, sputterings were each performed for 60 minutes, and it was checked whether or not the oxide sintered materials of the sputtering targets were cracked. When an oxide sintered material was cracked, the experiment was stopped and the sputtering power was regarded as the cracking power (W). Table 2 shows cracking powers of the Examples and the Comparative Examples. All the sputtering targets of the Examples were not cracked until the sputtering power became high. This is presumably because the inclusion of the second crystal phase having the predetermined average major axis size and average aspect ratio led to improved thermal conductivity and mechanical strength.

The sputtering target of Comparative Example 2 was severely cracked, with the result that a film cannot be formed by sputtering employing DC power.

(2-2) Production of Semiconductor Device (TFT) Including Oxide Semiconductor Film A TFT having a configuration similar to that of semiconductor device 30 shown in FIG. 3 was produced in the following procedure. First, with reference to FIG. 4A, a synthetic quartz glass substrate having a size of 50 mm×50 mm×0.6 mm in thickness was prepared as substrate 11, and a Mo electrode having a thickness of 100 nm was formed as gate electrode 12 on substrate 11 by the sputtering method. Next, as shown in FIG. 4A, gate electrode 12 was etched using a photoresist to have a predetermined shape.

With reference to FIG. 4B, next, a $SiO_x$ film serving as an amorphous oxide layer and having a thickness of 200 nm was formed as gate insulating film 13 on gate electrode 12 and substrate 11 by the plasma CVD method.

With reference to FIG. 4C, next, oxide semiconductor film 14 having a thickness of 35 nm was formed on gate insulating film 13 by the DC (direct current) magnetron sputtering method. A flat surface of the target with a diameter of 3 inches (76.2 mm) was a sputtering surface. As the target used, the oxide sintered material obtained above in (1) was used.

The following more specifically describes the formation of oxide semiconductor film 14. Substrate 11 having gate electrode 12 and gate insulating film 13 formed thereon was disposed on a water-cooled substrate holder in the film formation chamber of the sputtering apparatus (not shown) such that gate insulating film 13 was exposed. The target was disposed to face gate insulating film 13 with a distance of 90 mm therebetween. With the film formation chamber being set to have a vacuum of about $6\times10^{-5}$ Pa, the target was sputtered as follows.

First, in a state in which a shutter was placed between gate insulating film 13 and the target, a mixed gas of Ar (argon) gas and $O_2$ (oxygen) gas was introduced into the film formation chamber until the pressure therein reached 0.5 Pa. An $O_2$ gas content in the mixed gas was 20 volumes %. In each of Examples other than Examples 3, 5, 14, and 16 as well as Comparative Example 1, DC power lower by 50 W than the cracking power determined in (2-1) above was applied to the target to cause sputtering discharge, thereby cleaning (pre-sputtering) the surface of the target for 5 minutes. In each of Examples 3, 5, 14, and 16, DC power was set at 500 W to cause sputtering discharge, thereby performing pre-sputtering for 5 minutes. The DC power during the pre-sputtering is shown in Table 3.

Next, under conditions that DC power of the same value was applied to the same target and the atmosphere in the film formation chamber was maintained to be unchanged, the above-described shutter was removed, thereby forming oxide semiconductor film 14 on gate insulating film 13. It should be noted that no bias voltage was particularly applied to the substrate holder. Moreover, the substrate holder was water-cooled or heated to adjust the temperature of substrate 11 during and after the film formation. Regarding examples accompanied with the description "Performed/120° C." or the like in the column "Heating during Film Formation" in Table 3 below among the Examples and the Comparative Examples, heating was performed simultaneously with the film formation by heating the substrate holder during the film formation to adjust the substrate temperature to 120° C. or the like. In this case, the heating time corresponds to the film formation time. Also in the case of performing heating simultaneously with the film formation, the substrate was heated at 250° C. for 10 minutes or at 350° C. for 10 minutes after the film formation (after the formation of the passivation layer as described below), and then semiconductor device characteristics described later were measured. On the other hand, in the case of "Not Performed" in the column "Heating during Film Formation" in Table 3 below among the Examples and the Comparative Examples, the substrate holder was water-cooled during the film formation to set the substrate temperature at about 20° C., and the substrate was heated at 250° C. for 10 minutes or at 350° C. for 10 minutes after the film formation (after the formation of the passivation layer as described below), and the semiconductor device characteristics described later were measured.

In the manner described above, oxide semiconductor film 14 was formed by the DC (direct current) magnetron sputtering method employing the target obtained by processing the oxide sintered material obtained above in (1). Oxide semiconductor film 14 served as a channel layer in the TFT.

The film thickness of oxide semiconductor film 14 formed in each of the Examples and the Comparative Examples was 35 nm.

Next, oxide semiconductor film 14 thus formed were partially etched to form a source electrode formation portion 14s, a drain electrode formation portion 14d, and a channel portion 14c. The size of the main surface of each of source electrode formation portion 14s and drain electrode formation portion 14d was set at 50 μm×50 μm, channel length $C_L$ thereof was set at 30 μm (with reference to FIG. 1A and FIG. 1B, channel length $C_L$ refers to a distance of channel portion 14c between source electrode 15 and drain electrode 16), and channel width $C_W$ thereof was set at 40 μm (with reference to FIG. 1A and FIG. 1B, channel width $C_W$ refers to the width of channel portion 14c). 25 (at the longitudinal side)×25 (at the lateral side) of channel portions 14c were disposed at an interval of 3 mm within the substrate main surface of 75 mm×75 mm such that 25 (at the longitudinal side)×25 (at the lateral side) of TFTs were disposed at an interval of 3 mm within the substrate main surface of 75 mm×75 mm.

Oxide semiconductor film 14 was partially etched in the following manner: substrate 11 having gate electrode 12, gate insulating film 13, and oxide semiconductor film 14 formed thereon in this order was immersed, at 40° C., in an etching aqueous solution prepared to have a volume ratio of oxalic acid:water=5:95.

With reference to FIG. 4D, source electrode 15 and drain electrode 16 are then formed on oxide semiconductor film 14 to be separated from each other.

Specifically, first, a resist (not shown) was applied onto oxide semiconductor film 14, was exposed to light and was developed to expose only the respective main surfaces of source electrode formation portion 14s and drain electrode formation portion 14d of oxide semiconductor film 14. Next, the sputtering method was employed to form Mo electrodes each having a thickness of 100 nm and respectively serving as source electrode 15 and drain electrode 16 on the main surfaces of source electrode formation portion 14s and drain electrode formation portion 14d of oxide semiconductor film 14. Then, the resist on oxide semiconductor film 14 was removed. One Mo electrode serving as source electrode 15 and one Mo electrode serving as drain electrode 16 are disposed for one channel portion 14c such that 25 (at the longitudinal side)×25 (at the lateral side) of TFTs were disposed at an interval of 3 mm within the substrate main surface of 75 mm×75 mm.

Next, with reference to FIG. 3, passivation film 18 was formed on gate insulating film 13, oxide semiconductor film 14, source electrode 15, and drain electrode 16. Passivation film 18 had a configuration obtained by forming a $SiO_x$ film, which served as an amorphous oxide layer and had a thickness of 200 nm, by the plasma CVD method and then forming a $SiN_y$ film having a thickness of 200 nm by the plasma CVD method on the $SiO_x$ film. Alternatively, passivation film 18 had a configuration obtained by forming an $Al_mO_n$ film, which served as an amorphous oxide layer and had a thickness of 120 nm, by the sputtering method and then forming a $SiN_y$ film having a thickness of 200 nm on the $Al_mO_n$ film by the plasma CVD method. When the amorphous oxide layer is the $SiO_x$ film, the column "PV Layer" in Table 3 below indicates "$SiO_x$", whereas when the amorphous oxide layer is the $Al_mO_n$ film, the column "PV Layer" indicates "$Al_mO_n$". In order to improve reliability, in an atomic composition ratio of the $SiO_x$ film, an oxygen content is desirably closer to that in Si:O=1:2, whereas in an atomic composition ratio of the $Al_mO_n$ film, an oxygen content is desirably closer to that in Al:O=2:3.

Next, passivation film 18 on source electrode 15 and drain electrode 16 was etched by reactive ion etching to form a contact hole, thereby exposing portions of the surfaces of source electrode 15 and drain electrode 16.

Finally, heating was performed in a nitrogen atmosphere under an atmospheric pressure. This heating was performed in all the Examples and Comparative Examples, specifically, the heating was performed at 250° C. for 10 minutes in the nitrogen atmosphere or at 350° C. for 10 minutes in the nitrogen atmosphere. In this way, a TFT including oxide semiconductor film 14 as a channel layer was obtained.

(2-3) Crystallinity, W Content, Zn Content, and Zn/W Ratio of Oxide Semiconductor Film The crystallinity of oxide semiconductor film 14 included in the produced TFT was evaluated in accordance with the above-described measurement method and definition. The column "Crystallinity" in Table 3 describes "Nano Crystal" in the case of the nano crystal, and describes "Amorphous" in the case of amorphous. Moreover, the respective contents of In, W, and Zn in oxide semiconductor film 14 were measured by RBS (Rutherford Backscattering Spectrometry). Based on these contents, the W content (atom %), Zn content (atom %), and Zn/W ratio (atomic ratio) of oxide semiconductor film 14 were determined. Results thereof are shown in Table 3.

(2-4) Evaluation on Characteristics of Semiconductor Device

The characteristics of the TFT serving as semiconductor device 10 were evaluated as follows. First, a measurement needle was brought into contact with each of gate electrode 12, source electrode 15, and drain electrode 16. A source-drain voltage $V_{ds}$ of 0.2 V was applied between source electrode 15 and drain electrode 16, a source-gate voltage $V_{gs}$ applied between source electrode 15 and gate electrode 12 was changed from −10 V to 15 V, and a source-drain current $I_{ds}$ on this occasion was measured. Then, a relation between source-gate voltage $V_{gs}$ and a square root $((I_{ds})^{1/2})$ of source-drain current $I_{ds}$ was illustrated in a graph (hereinafter, this graph is also referred to as "$V_{gs}$−$(I_{ds})^{1/2}$ curve"). A threshold voltage $V_{th}$ was represented by a point (x intercept) at which the x axis ($V_{gs}$) crossed a line tangential to a point at which inclination of a tangential line drawn to the $V_{gs}$−$(I_{ds})^{1/2}$ curve was the maximum. Measurement of threshold voltage $V_{th}$ was performed for: the TFT having been through heating at 250° C. for 10 minutes in the nitrogen atmosphere under the atmospheric pressure ($V_{th}$ (250° C.)); and the TFT having been through heating at 350° C. for 10 minutes in the nitrogen atmosphere under the atmospheric pressure ($V_{th}$ (350° C.)). It is considered that $V_{th}$ is desirably not less than 0 V, and is desirably closer to 1.0 V to conform to driving voltage for a-Si when the TFT is used for a display device.

Moreover, $g_m$ was derived by differentiating source-drain current $I_{ds}$ with respect to source-gate voltage $V_{gs}$ in accordance with the following formula [a]:

$$g_m = dI_{ds}/dV_{gs} \quad [a].$$

Then, the value of $g_m$ with $V_{gs}$=10.0 V was used to determine field effect mobility $\mu_{fe}$ based on the following formula [b]:

$$\mu_{fe} = g_m \cdot C_L/(C_W \cdot C_i \cdot V_{ds}) \quad [b].$$

In the above formula [b], channel length $C_L$ was 30 μm and channel width $C_W$ was 40 μm. Moreover, capacitance $C_i$ of gate insulating film 13 was set at 3.4×10⁻⁸ F/cm², and source-drain voltage $V_{ds}$ was set at 0.5 V.

The column "Mobility (250° C.)" of Table 3 shows field effect mobility $w_e$ after heating at 250° C. for 10 minutes in the nitrogen atmosphere under the atmospheric pressure. Moreover, the column "Mobility (350° C.)" of Table 3 shows field effect mobility $\mu_{fe}$ after heating at 350° C. for 10 minutes in the nitrogen atmosphere under the atmospheric pressure. As shown in Table 3, as the Zn/W ratio is larger, a difference between the mobility (250° C.) and the mobility (350° C.) tends to be smaller.

Further, the following reliability evaluation test was performed. Source-gate voltage $V_{gs}$ applied between source electrode 15 and gate electrode 12 was fixed to +35V and was continued to be applied for 1 hour. After 1 s, 10 s, 100 s, 300 s and 3600 s from the start of the application, threshold voltage $V_{th}$ was determined by the above-described method, and a difference $\Delta V_{th}$ was determined between maximum threshold voltage $V_{th}$ and minimum threshold voltage $V_{th}$. As $\Delta V_{th}$ is smaller, it is determined that reliability is higher. The column "$\Delta V_{th}$ (250° C.)" of Table 3 shows $\Delta V_{th}$ after heating at 250° C. for 10 minutes in the nitrogen atmosphere under the atmospheric pressure. Moreover, the column "$\Delta V_{th}$ (350° C.)" of Table 3 shows $\Delta V_{th}$ after heating at 350° C. for 10 minutes in the nitrogen atmosphere under the atmospheric pressure. In Examples 2 and 3, Examples 4 and 5, and Examples 13, 14 15, and 16, the same sputtering targets were used and only DC powers were different. As DC power is higher, reliability is higher.

TABLE 3

| | Oxide Semiconductor Film | | | | | | |
|---|---|---|---|---|---|---|---|
| | Crystallinity | W Content (atom %) | Zn Content (atom %) | Zn/W Ratio (atomic ratio) | Heating during Film Formation | DC Power (W) | PV Layer |
| Example 1 | Amorphous | 0.7 | 2 | 2.9 | Performed/120° C. | 600 | AlmOn |
| Example 2 | Nano Crystal | 1.0 | 10 | 10.0 | Performed/100° C. | 650 | AlmOn |
| Example 3 | Nano Crystal | 1.0 | 18 | 18.0 | Not Performed | 650 | AlmOn |
| Example 4 | Nano Crystal | 1.0 | 18 | 18.0 | Not Performed | 500 | AlmOn |
| Example 5 | Nano Crystal | 1.0 | 31 | 31.0 | Not Performed | 650 | AlmOn |
| Example 6 | Nano Crystal | 1.0 | 31 | 31.0 | Not Performed | 500 | AlmOn |
| Example 7 | Nano Crystal | 1.5 | 34 | 22.7 | Not Performed | 600 | AlmOn |
| Example 8 | Nano Crystal | 2.0 | 34 | 17.0 | Not Performed | 600 | AlmOn |
| Example 9 | Nano Crystal | 3.0 | 34 | 11.3 | Not Performed | 600 | AlmOn |
| Example 10 | Nano Crystal | 5.0 | 39 | 7.8 | Not Performed | 650 | AlmOn |
| Example 11 | Nano Crystal | 0.6 | 18 | 30.0 | Not Performed | 650 | SiOx |
| Example 12 | Amorphous | 1.0 | 4 | 4.0 | Not Performed | 600 | SiOx |
| Example 13 | Nano Crystal | 1.0 | 17 | 17.0 | Not Performed | 700 | SiOx |
| Example 14 | Nano Crystal | 1.0 | 17 | 17.0 | Not Performed | 500 | SiOx |
| Example 15 | Nano Crystal | 1.0 | 21 | 21.0 | Not Performed | 700 | SiOx |
| Example 16 | Nano Crystal | 1.0 | 21 | 21.0 | Not Performed | 500 | SiOx |
| Example 17 | Nano Crystal | 1.5 | 30 | 20.0 | Not Performed | 650 | SiOx |
| Example 18 | Nano Crystal | 2.0 | 17 | 8.5 | Not Performed | 600 | SiOx |
| Example 19 | Nano Crystal | 3.0 | 17 | 5.7 | Not Performed | 600 | SiOx |
| Example 20 | Nano Crystal | 5.0 | 17 | 3.4 | Not Performed | 600 | SiOx |
| Comparative Example 1 | Nano Crystal | 1.0 | 30 | 30.0 | Not Performed | 500 | SiOx |
| Comparative Example 2 | — | — | — | — | — | — | — |

| | Evaluation on Characteristics of Semiconductor Device | | | | | |
|---|---|---|---|---|---|---|
| | Mobility (250° C.) (cm²/Vs) | Mobility (350° C.) (cm²/Vs) | $V_{th}$ (250° C.) (V) | $V_{th}$ (350° C.) (V) | $\Delta V_{th}$ (250° C.) (V) | $\Delta V_{th}$ (350° C.) (V) |
| Example 1 | 42 | 18 | −2.5 | 0.2 | 0.53 | 0.25 |
| Example 2 | 35 | 35 | −1.2 | 1.6 | 0.41 | 0.21 |
| Example 3 | 37 | 35 | −1.8 | 0.9 | 0.43 | 0.21 |
| Example 4 | 36 | 34 | −2.0 | 0.6 | 0.53 | 0.46 |
| Example 5 | 34 | 33 | −2.0 | 0.7 | 0.45 | 0.22 |
| Example 6 | 33 | 32 | −2.2 | 0.5 | 0.52 | 0.46 |
| Example 7 | 32 | 30 | −1.2 | 1.6 | 0.42 | 0.22 |
| Example 8 | 28 | 28 | −0.7 | 2.1 | 0.40 | 0.19 |
| Example 9 | 25 | 23 | 0.0 | 2.4 | 0.37 | 0.10 |
| Example 10 | 24 | 22 | 0.3 | 3.1 | 0.35 | 0.17 |
| Example 11 | 50 | 27 | −2.7 | 0.2 | 0.51 | 0.24 |
| Example 12 | 48 | 17 | −0.8 | 2.1 | 0.47 | 0.23 |
| Example 13 | 47 | 45 | −1.8 | 0.9 | 0.43 | 0.22 |
| Example 14 | 45 | 44 | −1.9 | 0.8 | 0.50 | 0.44 |
| Example 15 | 46 | 44 | −1.9 | 0.6 | 0.45 | 0.24 |
| Example 16 | 45 | 43 | −2.0 | 0.5 | 0.49 | 0.43 |
| Example 17 | 44 | 41 | −1.5 | 1.4 | 0.41 | 0.19 |
| Example 18 | 42 | 40 | −1.2 | 1.5 | 0.38 | 0.18 |
| Example 19 | 38 | 38 | 0.1 | 2.4 | 0.36 | 0.17 |
| Example 20 | 36 | 36 | 0.6 | 3.6 | 0.35 | 0.16 |
| Comparative Example 1 | 40 | 11 | −5.2 | −1.5 | 0.54 | 0.52 |
| Comparative Example 2 | — | — | — | — | — | — |

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST 10, 20, 30: semiconductor device (TFT); 11: substrate; 12: gate electrode; 13: gate insulating film; 14: oxide semiconductor film; 14c: channel portion; 14d: drain electrode formation portion; 14s: source electrode formation portion; 15: source electrode; 16: drain electrode; 17: etch stopper layer; 17a: contact hole; 18: passivation film.

The invention claimed is:

1. An oxide sintered material containing indium, tungsten, and zinc, the oxide sintered material comprising:
    a first crystal phase that is a main component of the oxide sintered material and includes a bixbyite type crystal phase; and
    a second crystal phase having a content of the zinc higher than a content of the zinc in the first crystal phase,
    the second crystal phase including particles having an average major axis size of not less than 3 μm and not more than 50 μm and having an average aspect ratio of not less than 4 and not more than 50.

2. The oxide sintered material according to claim 1, wherein
    the oxide sintered material has a first diffraction peak at a location of more than 34.74 deg and less than 34.97 deg of 2θ in X-ray diffraction, and has a second diffraction peak at a location of more than 31.77 deg and less than 32.00 deg of 2θ, and
    a ratio Ia/Ib of a peak intensity Ia of the first diffraction peak to a peak intensity Ib of the second diffraction peak is not less than 0.05 and not more than 3.

3. The oxide sintered material according to claim 1, wherein
    the oxide sintered material has an apparent density of more than 6.4 g/cm$^3$ and not more than 7.5 g/cm$^3$,
    a content of the tungsten relative to a total of the indium, the tungsten, and the zinc in the oxide sintered material is more than 0.5 atom % and not more than 5.0 atom %,
    a content of the zinc relative to the total of the indium, the tungsten, and the zinc in the oxide sintered material is not less than 1.2 atom % and less than 50 atom %, and
    an atomic ratio of the zinc to the tungsten in the oxide sintered material is more than 1.0 and less than 100.

4. A sputtering target comprising the oxide sintered material recited in claim 1.

* * * * *